United States Patent
Ip

(10) Patent No.: US 11,335,607 B2
(45) Date of Patent: May 17, 2022

(54) APPARATUS AND METHODS FOR WAFER TO WAFER BONDING

(71) Applicant: Tokyo Electron Limited, Tokyo (JP)

(72) Inventor: Nathan Ip, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 16/924,847

(22) Filed: Jul. 9, 2020

(65) Prior Publication Data

US 2022/0013416 A1 Jan. 13, 2022

(51) Int. Cl.

| G11C 16/04 | (2006.01) |
|---|---|
| H01L 21/66 | (2006.01) |
| H01L 23/00 | (2006.01) |
| H01L 21/18 | (2006.01) |
| G06F 30/27 | (2020.01) |

(52) U.S. Cl.
CPC .............. *H01L 22/12* (2013.01); *G06F 30/27* (2020.01); *H01L 21/187* (2013.01); *H01L 22/20* (2013.01); *H01L 24/94* (2013.01); *B81C 2203/0118* (2013.01); *G05B 2219/37224* (2013.01); *H01L 2224/828* (2013.01)

(58) Field of Classification Search
CPC ....... H01L 22/12; H01L 21/187; H01L 22/20; H01L 24/91; H01L 2224/828
See application file for complete search history.

(56) References Cited

U.S. PATENT DOCUMENTS

| 7,463,941 | B2 | 12/2008 | Ogawa et al. | |
|---|---|---|---|---|
| 9,390,949 | B2 * | 7/2016 | Chiou | ............... H01L 21/67173 |
| 9,864,280 | B2 * | 1/2018 | Bangar | ............... G03F 7/70633 |
| 10,872,873 | B2 * | 12/2020 | Chen | ............... H01L 21/187 |
| 10,886,256 | B2 * | 1/2021 | Guo | ............... H01L 22/20 |
| 2008/0070376 | A1 | 3/2008 | Vaganov et al. | |
| 2012/0007329 | A1 | 3/2012 | Broekaart et al. | |
| 2013/0153116 | A1 | 6/2013 | Hirakawa et al. | |
| 2020/0335472 | A1 | 10/2020 | Okamoto et al. | |

FOREIGN PATENT DOCUMENTS

| JP | 2006293433 A | 10/2006 |
|---|---|---|
| WO | 2013145622 A1 | 10/2013 |

OTHER PUBLICATIONS

International Searching Authority, Notification of Transmittal of the International Search Report and the Written Opinion of the International Searching Authority, or the Declartion, issued in International Application No. PCT/US2020/042286, dated Apr. 8, 2021, 10 pages.

* cited by examiner

*Primary Examiner* — Pho M Luu
(74) *Attorney, Agent, or Firm* — Slater Matsil, LLP

(57) ABSTRACT

A method includes having a first wafer bonding recipe and a model of a wafer bonding process, the model comprising an input indicative of a physical parameter of a first wafer to be bonded to a second wafer and configured to output a wafer bonding recipe based on the physical parameter of the first wafer; obtaining measurements of the first wafer to obtain the physical parameter of the first wafer; generating, by the model, the first wafer bonding recipe based on the physical parameter of the first wafer; and bonding the first wafer to the second wafer in accordance with the first wafer bonding recipe to produce a first post-bond wafer.

21 Claims, 11 Drawing Sheets

APPARATUS AND METHODS FOR WAFER TO WAFER BONDING

TECHNICAL FIELD

The present invention relates generally to substrate processing, and, in particular embodiments, to apparatus and methods of wafer to wafer bonding.

BACKGROUND

Wafer to wafer bonding is a packaging technology used in the production of microelectromechanical systems (MEMS), nanoelectromechanical systems (NEMS), microelectronics and optoelectronics. Fusion bonding (also commonly referred to as direct bonding) is a wafer to wafer bonding process that does not require any additional intermediate layers. In fusion bonding, two wafers (e.g., a top wafer and a bottom wafer) are brought together and the two wafers begin to bond as the surfaces of the wafers begin to touch, forming a post-bond wafer. Annealing the post-bond wafers at elevated temperatures increases the bond strength between the two wafers and forms a fusion bonded wafer.

FIG. 1A illustrates a portion of a wafer to wafer bonding process 100 for bonding two wafers using a conventional fusion bonding process. In fusion bonding, a top wafer 105 and a bottom wafer 110 are bonded to form a post-bond wafer 115. Fusion bonding also includes annealing the post-bond wafers to strengthen the bond between the two wafers, which is not shown in FIG. 1A.

The quality of a wafer to wafer bond may be dependent upon a variety of factors that may be grouped into two distinct categories: wafer characteristics and process conditions. Examples of wafer characteristics include wafer flatness, wafer smoothness, wafer cleanliness, wafer materials, and so on, while examples of process conditions include bonding temperature, environmental conditions in a bonding chamber where the wafer to wafer bonding is performed, applied force, and so on.

FIG. 1B illustrates a side-view of post-bond wafer 115. As shown in FIG. 1B, top wafer 105 and bottom wafer 110 are well-bonded together and there is a smooth interface between the two wafers. FIG. 1C illustrates a side view of post-bond wafer 130 highlighting a poor bond between the two wafers. As shown in FIG. 1C, top wafer 105 has a concave profile, which leads to the formation of a gap 135 when top wafer 105 and bottom wafer no are bonded.

SUMMARY

In accordance with an embodiment of the invention, a method is provided. The method includes: having a first wafer bonding recipe and a model of a wafer bonding process, the model comprising an input indicative of a physical parameter of a first wafer to be bonded to a second wafer and configured to output a wafer bonding recipe based on the physical parameter of the first wafer; obtaining measurements of the first wafer to obtain the physical parameter of the first wafer; generating, by the model, the first wafer bonding recipe based on the physical parameter of the first wafer; and bonding the first wafer to the second wafer in accordance with the first wafer bonding recipe to produce a first post-bond wafer.

In accordance with another embodiment, a method is provided. The method includes: having a model of a wafer bonding process, the model comprising an input indicative of a physical parameter of a first post-bond wafer and configured to output a wafer bonding recipe based on the physical parameter of the first post-bond wafer; bonding a first wafer to a second wafer in accordance with a wafer bonding recipe, to form the first post-bond wafer; obtaining measurements of the first post-bond wafer to obtain the physical parameter of the first post-bond wafer; generating, by the model, the first wafer bonding recipe in accordance with the physical parameter of the first post-bond wafer; and bonding a third wafer to a fourth wafer in accordance with the first wafer bonding recipe, to form a second post-bond wafer.

In accordance with still another embodiment of the invention, a processing system is provided. The processing system includes: a non-transitory computer-readable storage medium comprising instructions that when executed cause a processor of a computing device to perform operations in coordination with a semiconductor wafer fabrication process, the instructions comprising: having a first wafer bonding recipe and a model of a wafer bonding process, the model comprising an input indicative of a physical parameter of a first wafer to be bonded to a second wafer and configured to output a wafer bonding recipe based on the physical parameter of the first wafer; obtaining measurements of the first wafer to obtain the physical parameter of the first wafer; generating, by the model, the first wafer bonding recipe based on the physical parameter of the first wafer; and bonding the first wafer to the second wafer in accordance with the first wafer bonding recipe to produce a first post-bond wafer.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale. The edges of features drawn in the figures do not necessarily indicate the termination of the extent of the feature.

DETAILED DESCRIPTION OF ILLUSTRATIVE EMBODIMENTS

The making and using of various embodiments are discussed in detail below. It should be appreciated, however, that the various embodiments described herein are applicable in a wide variety of specific contexts. The specific embodiments discussed are merely illustrative of specific ways to make and use various embodiments, and should not be construed in a limited scope.

Various techniques, as described herein, pertain to wafer fusion bonding using wafer metrology data to dynamically control the wafer bonding recipe to control post-bond wafer distortion. As an example, the wafer metrology data is provided to a model of the wafer bonding process to determine process conditions of the wafer bonding process that is predicted to produce post-bond wafers that meet a post-bond distortion threshold, which may then be applied to the actual bonding of the wafers. In other words, the wafer metrology data is used to tune a wafer bonding recipe that will produce post-bond wafers that meet the post-bond distortion threshold.

Figure 1A:
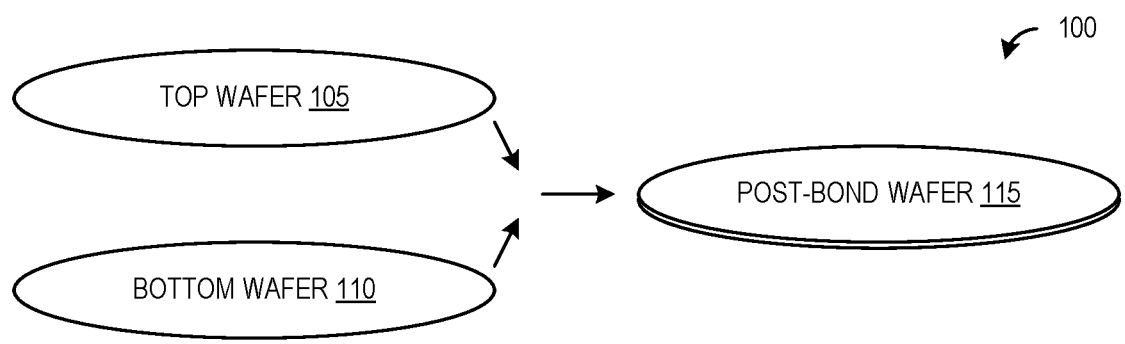
FIG. 1A illustrates a portion of a wafer to wafer bonding process for bonding two wafers using a conventional fusion bonding process.
Figure 1B:
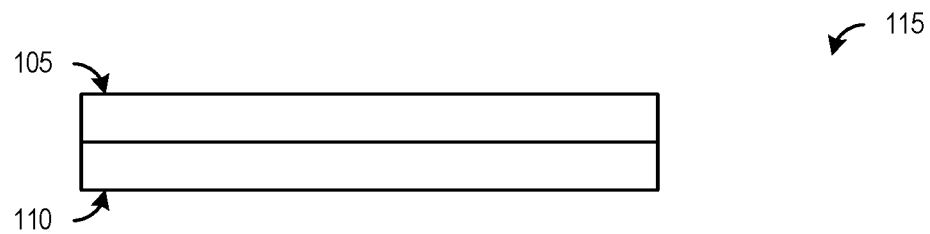
FIGS. 1B-1C illustrate side-views of post-bond wafers.
Figure 1C:
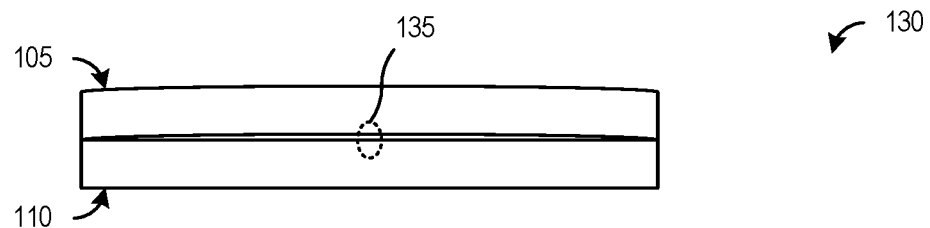
Figure 2:
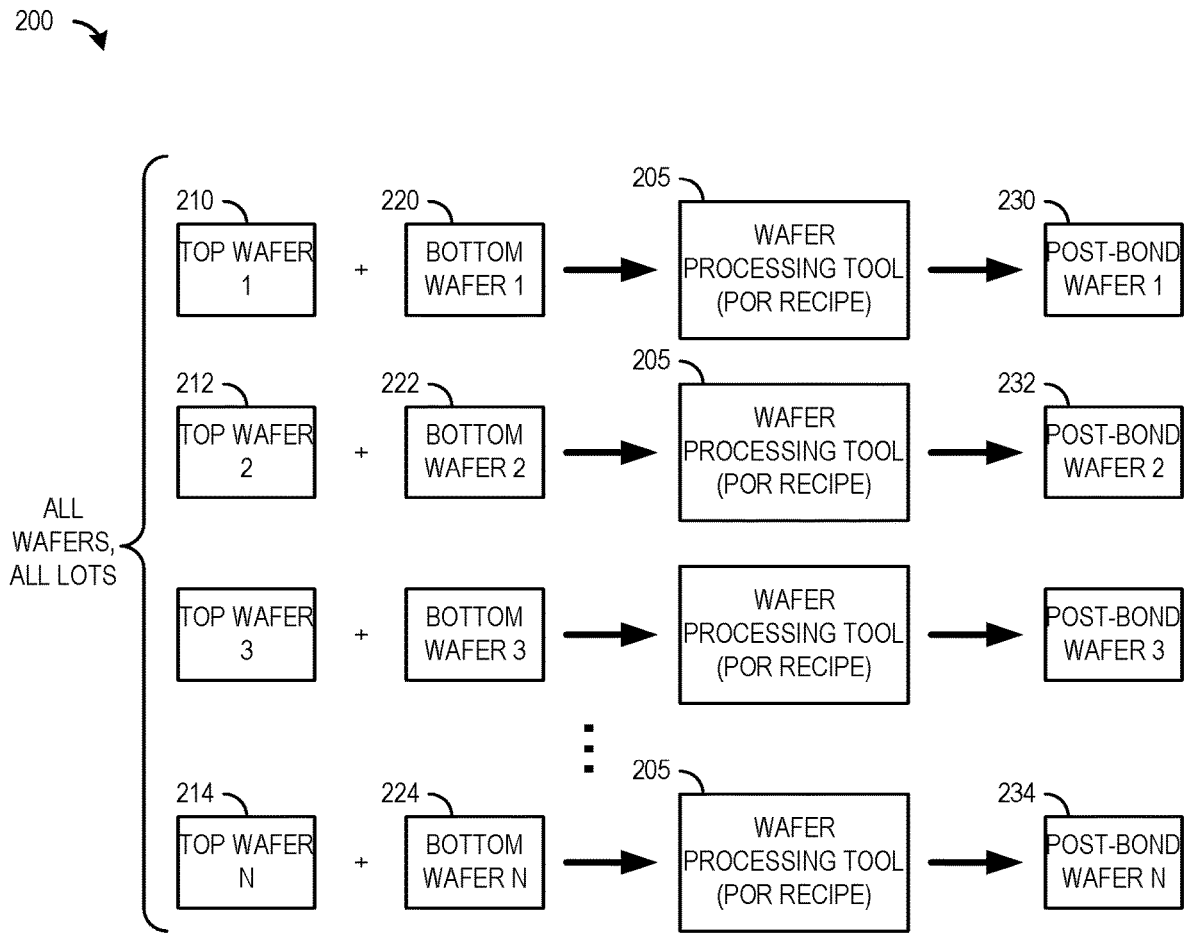
FIG. 2 illustrates a conventional wafer fusion bonding process.

FIG. 2 illustrates a conventional wafer fusion bonding process 200. As shown in FIG. 2, a wafer processing tool 205 fusion bonds a first top wafer 210 and a first bottom wafer 220 using a process of record (POR) wafer bonding recipe to form a first post-bond wafer 230. Typically, a plurality of top wafers is bonded with a plurality of bottom wafers to form a plurality of post-bond wafers. As an example, second top wafer 212 is bonded with second bottom wafer 222 to form second post-bond wafer 232, and N-th top wafer 214 is bonded with N-th bottom wafer 224 to form N-th post-bond wafer 234. The annealing stage of conventional wafer fusion bonding process 200 is not shown in FIG. 2.

In the conventional wafer fusion bonding process, the same POR wafer bonding recipe is used for all of the top and bottom wafers, independent of if the top and bottom wafers belong to the same respective wafer lots or not.

Wafers are commonly processed in lots. One lot may contain up to 25 wafers with one of the 25 wafers being a monitor wafer that may or may not be used in the bonding process, for example. Inter-lot wafer variation is a significant contributor to post-bond wafer distortion. Production wafers usually vary from one lot to another, possibly due to processing conditions due to process control variations of prior steps, intrinsic wafer deformation, or other less obvious factors. The variation between wafers is referred to as the shape variation. The shape variation can be local, meaning an averaged surface map of one lot of wafers looks entirely different from an averaged surface map of another lot of wafers, with one standard deviation of the shape variation ranging from 1 μm up to 5 μm in 300 mm wafers with logic devices, for example. The shape variation may be different in wafers with memory devices. The shape variation can also be global, meaning the peak-to-valley variation can be on the order of 10 μm or more from lot to lot. For memory applications, it is possible that the shape variation is much larger. Intra-lot variation is usually small, except in the case of split lots. A split lot means that subsets of the wafers within a lot are separated and are processed differently. When split lots are not considered, the intra-lot variation is typically far less than 10% of the inter-lot variation, however actual values may differ depending on the wafers being considered.

The shape variation is directly correlated to in-plane distortion (or simply referred to as "distortion"). The in-plane distortion of a wafer is defined as deviation along the major plane of the wafer. As an example, high spots (e.g., peaks) and low spots (e.g., valleys) on the surface of a wafer are in-plane distortions of the wafer. Observations have shown that 1 μm of shape variation may be attributed to approximately 5 nm of in-plane distortion. Therefore, in-plane distortion is a critical metric for wafer bonding process performance.

One way to evaluate the quality of a wafer bonding process is to examine the post-bond wafer. For example, if the shape variation of the post-bond wafers is high, then the wafer bonding process may not be well tuned to the wafers being bonded. While if the shape variation of the post-bond wafers is low, then the wafer bonding process may be well tuned to the wafers being bonded. For another example, if the shape variation of the post-bond wafers is low for intra-lot wafers but is high for inter-lot wafers, then the wafer bonding process may be well tuned for the particular lot of wafers, but not for a different lot of wafers.

In the case where both wafers being bonded are patterned (i.e., both wafers include devices and/or structures), the alignment between the patterns of the two substrates along the bonding interface is important. Alignment marks on each patterned layer may be measured by a scanner at a post-bonding step. The scanner measurement step may not be necessarily performed immediately after the bonding step. As an example, the post-bond wafer may be annealed in a processing chamber at elevated temperature (hundreds of degrees Celsius, for example) to improve the bonding strength between the two layers. As another example, one of the wafers may be thinned by grinding to expose the bonding interface. Other less obvious steps may also exist in between the wafer bonding step and the post-bond metrology step. In any case, the absolute shift between the two wafers of the post-bond wafer is of critical importance. Typical post-bond alignment error at one standard deviation variation can be about 30 nm, for example.

In the case where only one wafer is patterned, the post-bond distortion of the patterned wafer is important. The post-bond distortion may be a function of the shape variation of both pre-bond wafers, as well as the wafer bonding process. Some important factors that determine the post-bond distortion include the temperature distribution of the wafers, chucking forces on the wafers, adhesion between the wafers, surface roughness of the bonding surfaces of the two wafers, chuck flatness, spacing between the wafers prior to the bonding process, pre-cleaning of the two target bonding surfaces, and many other factors not listed here. After bonding, the post-bond distortion may be measured by the scanner as well, similar to the case where both wafers are patterned. However, in this case, the post-bond distortion is defined as the absolute deviation from an ideal distortion. The ideal distortion may be defined by the scanner. There are many models that the scanner may adopt to define the ideal distortion. Traditionally, the scanner uses a 6-term model for the ideal distortion. The 6 terms include magnification and tilt of the distortion surface maps. More recently, models have become more complicated, for example, a 33-term model has been proposed. Some state-of-the-art technology support free-form models (thousands of terms). A challenge that arises from selecting one of the high complexity models is that the time and cost required to create such model becomes unfeasible in the production environment.

Furthermore, post-bond distortion is becoming an increasingly difficult production target to meet. As an example, the current state-of-the-art post-bond distortion threshold has a one standard deviation of 10 nm or less, with customer requirements for post-bond distortion continuing to decrease in both the near term and the long term.

Because the conventional wafer bonding process shown in FIG. 2 uses a single POR wafer bonding recipe to bond wafers (independent of whether or not the wafers being bonded are intra-lot or inter-lot wafers), the bonding process related factors that impact post-bond distortion (i.e., the factors that are controlled by the POR wafer bonding recipe, such as temperature distribution of the wafers, chucking forces on the wafers, chuck flatness, spacing between the wafers prior to the bonding process, pre-cleaning of the two target bonding surfaces, and so on) remain fixed, while shape variation of the wafers changes between individual wafers and wafer lots. Therefore, inter-lot post-bond distortion control may be poor because inter-lot shape variation may be large and the fixed wafer bonding recipe does not compensate for inter-lot shape variation.

According to an example embodiment, a wafer bonding system is provided that utilizes wafer metrology data to tune a wafer bonding recipe. The wafer metrology data is provided to a model of the wafer bonding process, and the model tunes the process conditions of the wafer bonding recipe to produce post-bond wafers that meet a post-bond distortion threshold.

While post-bond distortion directly measured on the wafer is important, the cost involved in performing this measurement is high for research and development purposes. For example, the time to perform all of the aforementioned bonding steps before the metrology step is very long, possibly on the order of weeks. In an embodiment, instead of direct post-bond distortion measurements, physical parameters, such as wafer shape data, of the wafer can be measured for the post-bond wafer and used as a proxy to estimate the post-bond distortion. As an example, the wafer shape data is the form of a high density gridded map of the topology of a freestanding wafer. The grid may have a lateral resolution of 0.5 mm, for example, and measured over the entire wafer. As an example, the wafer shape metrology should have a resolution of less than 1 nm in an out-of-plane direction, which may be defined as deviation along a plane orthogonal to the major plane of the wafer. The wafer shape data may be directly correlated to the distortion through geometric formulations. Examples of geometric formulations include those that correlate wafer shape data and distortion based on the theory of elasticity, beam theory, or free-form wafer shape measurements.

In an embodiment, the wafer metrology data comprises metrology data for pre-bond wafers (e.g., wafer metrology data for the top wafers, the bottom wafers, or both the top and bottom wafers), and the wafer metrology data is provided to the model to tune the process conditions of the wafer bonding recipe to produce post-bond wafers that meet the post-bond distortion threshold. In other words, the model is used to tune the process conditions of the wafer bonding recipe to produce post-bond wafers that meet the post-bond distortion threshold, given the wafer metrology data of the pre-bond wafers. The model predicts the post-bond distortion of the post-bond wafers based on the wafer metrology data of the pre-bond wafers and tunes the wafer bonding recipe to produce post-bond wafers that meet the post-bond distortion threshold. This mode of operation is referred to as feedforward operation. A detailed description of feedforward operation is provided below.

In an embodiment, the wafer metrology data comprises metrology data for post-bond wafers, and the wafer metrology data is provided to the model to tune the process conditions of the wafer bonding recipe to produce post-bond wafers that meet the post-bond distortion threshold. In other words, the model is used to tune the process conditions of the wafer bonding recipe, based on the metrology data of the post-bond wafers, to produce post-bond wafers that meet the post-bond distortion threshold. This mode of operation is referred to as feedback operation. A detailed description of feedback operation is provided below.

In an embodiment, the wafer metrology data comprises metrology data for both pre-bond wafers and post-bond wafers, and the metrology data is provided to the model to tune the process conditions of the wafer bonding recipe to product post-bond wafers that meet the post-bond distortion threshold. Because the metrology data of both the pre-bond wafers and the post-bond wafers is available, the model may be used to both predict the post-bond distortion of the post-bond wafers based on the wafer metrology data of the pre-bond wafers and tune the process conditions of the wafer bonding recipe, based on the metrology data of both the pre- and post-bond wafers, to produce post-bond wafers that meet the post-bond distortion threshold.

Figure 3:
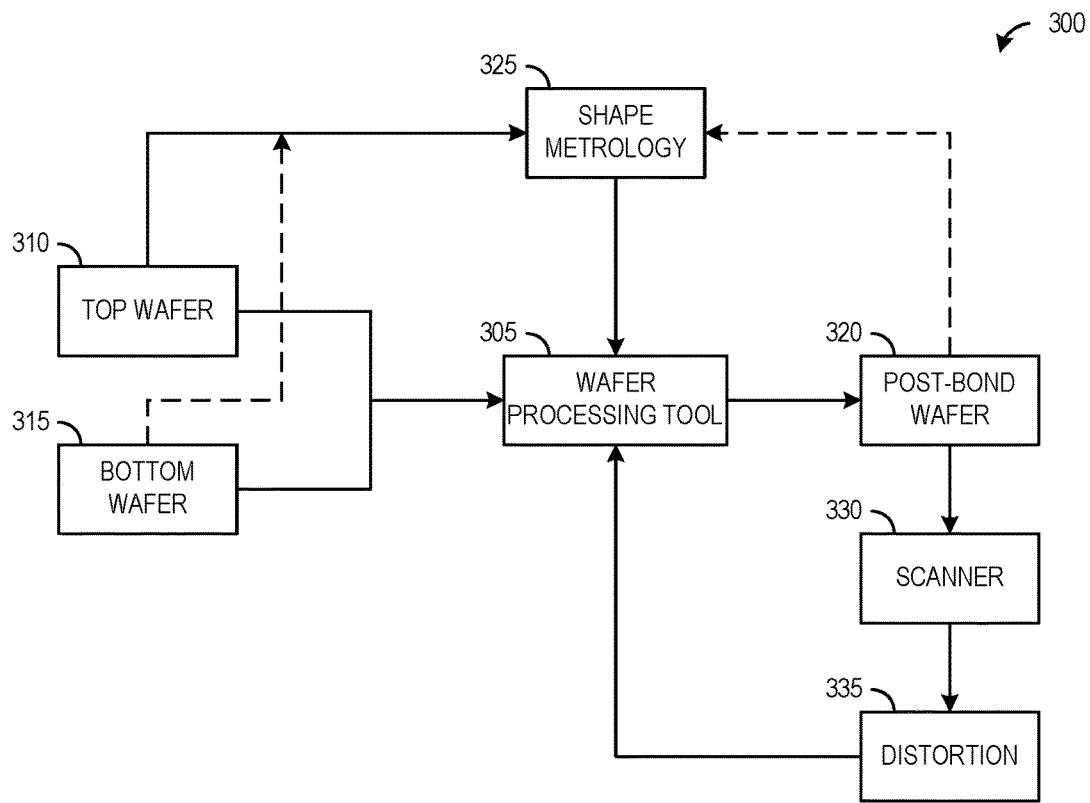
FIG. 3 illustrates a wafer bonding system that utilizes wafer metrology data to tune a wafer bonding recipe according to the example embodiments presented herein.

FIG. 3 illustrates a wafer bonding system 300 that utilizes wafer metrology data to tune a wafer bonding recipe according to the example embodiments presented herein. In an embodiment, wafer bonding system 300 uses wafer metrology data of pre-bond wafers (either the top wafer, the bottom wafer, or both the top and bottom wafers) and/or post-bond wafers to tune process conditions of the wafer bonding recipe to produce post-bond wafers that meet a post-bond distortion threshold.

Wafer bonding system 300 includes a wafer processing tool 305 that bonds pre-bond wafers (i.e., a top wafer 310 and a bottom wafer 315) to produce a post-bond wafer 320. Wafer processing tool 305 is widely available commercially. Wafer bonding system 300 includes a shape metrology tool 325 that measures physical parameters, such as wafer shape data, of top wafer 310, bottom wafer 315, or both top wafer 310 and bottom wafer 315. An example of shape metrology tool 325 is a surface profilometer. Another example of shape metrology tool 325 is a lithography surface scanner, such as atomic force microscopy tools, critical-dimension scanning electron microscopes, and so on. The physical parameters may be provided to wafer processing tool 305 to tune the wafer bonding recipe used to bond the pre-bond wafers so that the resulting post-bond wafer 320 meets post-bond distortion parameters.

As shown in FIG. 3, wafer bonding system 300 is configured to bond pre-bond wafers where top wafer 310 is the patterned wafer and bottom wafer 315 is the carrier wafer, hence it may not be necessary to measure physical parameters of bottom wafer 315. Therefore, the line between bottom wafer 315 and shape metrology tool 325 is shown as a dashed line. However, in a different configuration, physical parameters of bottom wafer 315 may be obtained and used to tune the wafer bonding recipe even when bottom wafer 315 is the carrier wafer. Furthermore, in a situation where top wafer 310 is the carrier wafer and bottom wafer 315 is the patterned wafer, then the physical parameters of bottom wafer 315 would be measured and provided to wafer processing tool 305 to tune the wafer bonding recipe, while the measuring of the physical parameters of top wafer 310 may be optional. In the situation where both top wafer 310 and bottom wafer 315 are patterned, the physical parameters of both wafers should be measured and provided to wafer processing tool 305.

Wafer bonding system 300 also includes a scanner 330 that scans post-bond wafer 320 to determine distortion data (such as post-bond distortion data) of post-bond wafer 320. The distortion data may be provided to wafer processing tool 305 to tune the wafer bonding recipe to help ensure that post-bond wafers meet post-bond distortion parameters. In some embodiments, scanner 330 is also used as shape metrology tool 325 to measure physical parameters of the pre-bond wafers.

In an embodiment, physical parameters of post-bond wafer 320 are provided to wafer processing tool 305 to tune the wafer bonding recipe used to bond the pre-bond wafers. Because it is necessary to measure physical parameters of post-bond wafer 320 in this particular embodiment but not in all embodiments, the line between post-bond wafer 320 and shape metrology tool 325 is shown as a dashed line.

Figure 4:
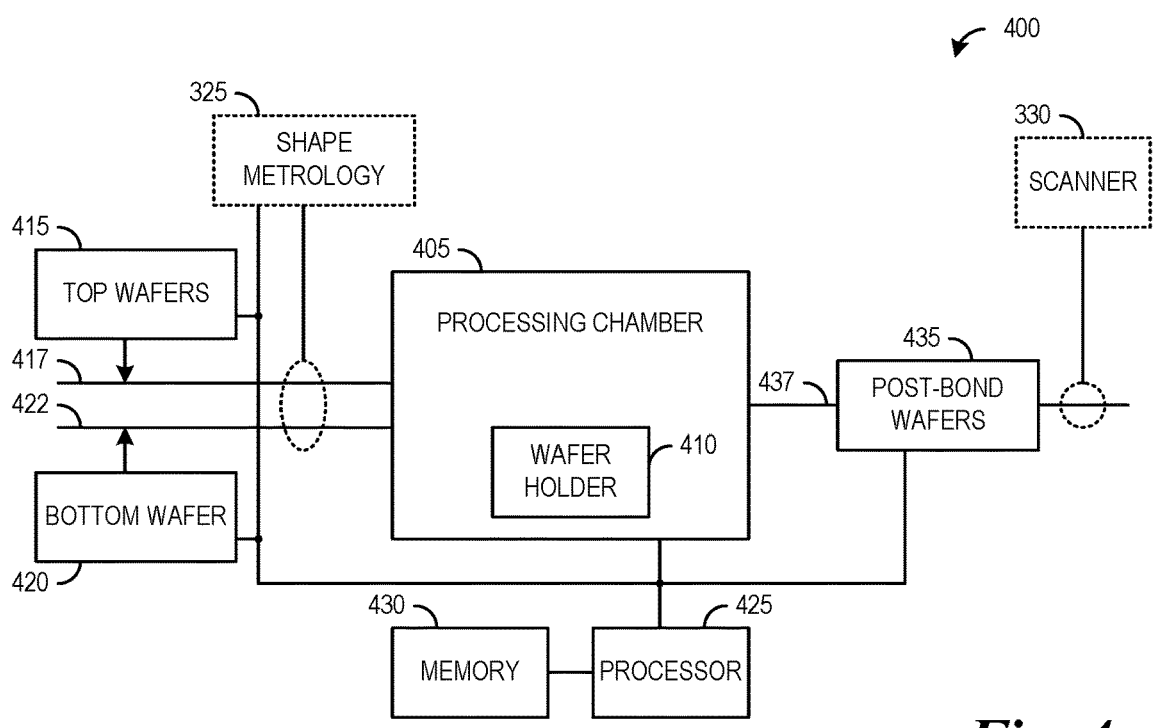
FIG. 4 illustrates an example wafer processing tool according to example embodiments presented herein.

FIG. 4 illustrates an example wafer processing tool 400 according to example embodiments presented herein. Wafer processing tool 400 may be an example implementation of wafer processing tool 305 of FIG. 3, for example.

Wafer processing tool 400 includes a processing chamber 405 where the bonding of the top wafer and the bottom wafer takes place. Processing chamber 405 provides a controlled environment, such as temperature, atmospheric pressure, plasma power, and so forth. Processing chamber 405 includes a wafer holder 410. In an embodiment, wafer holder 410 includes a top chuck for holding a top wafer and a bottom chuck for holding a bottom wafer. Top wafers 415 and bottom wafers 420 may be transported into processing chamber 405 by a top transport mechanism 417 and a bottom transport mechanism 422, respectively.

In an embodiment, as the top wafers and bottom wafers are transported to processing chamber 405, shape metrology tool 325 measures the wafers, determining physical parameters for the wafers. A processor 425 tunes the process conditions of the wafer bonding recipe in accordance with the physical parameters to produce a post-bond wafer that meets the post-bond distortion threshold. A detailed description of the tuning of the process conditions is provided below.

In an embodiment, the top wafers and bottom wafers are pre-measured, by shape metrology tool 325 or some other shape metrology tool, before being loaded into wafer processing tool 400 and the physical parameters for the wafers are stored in a database stored in a memory 425, for example. Then, as the top wafers and bottom wafers enter processing chamber 405, a processor 430 retrieves the physical parameters for the wafers and tunes the process conditions of the wafer bonding recipe in accordance with the physical parameters to produce a post-bond wafer that meets the post-bond distortion threshold. A detailed description of the tuning of the process conditions is provided below.

A transport mechanism 437 moves post-bond wafers 435 from processing chamber 405. Scanner 330 scans post-bond wafers 435 to determine distortion data (such as post-bond distortion data) of the post-bond wafers. The distortion data may also be stored in a database stored in memory 430.

Figure 5:
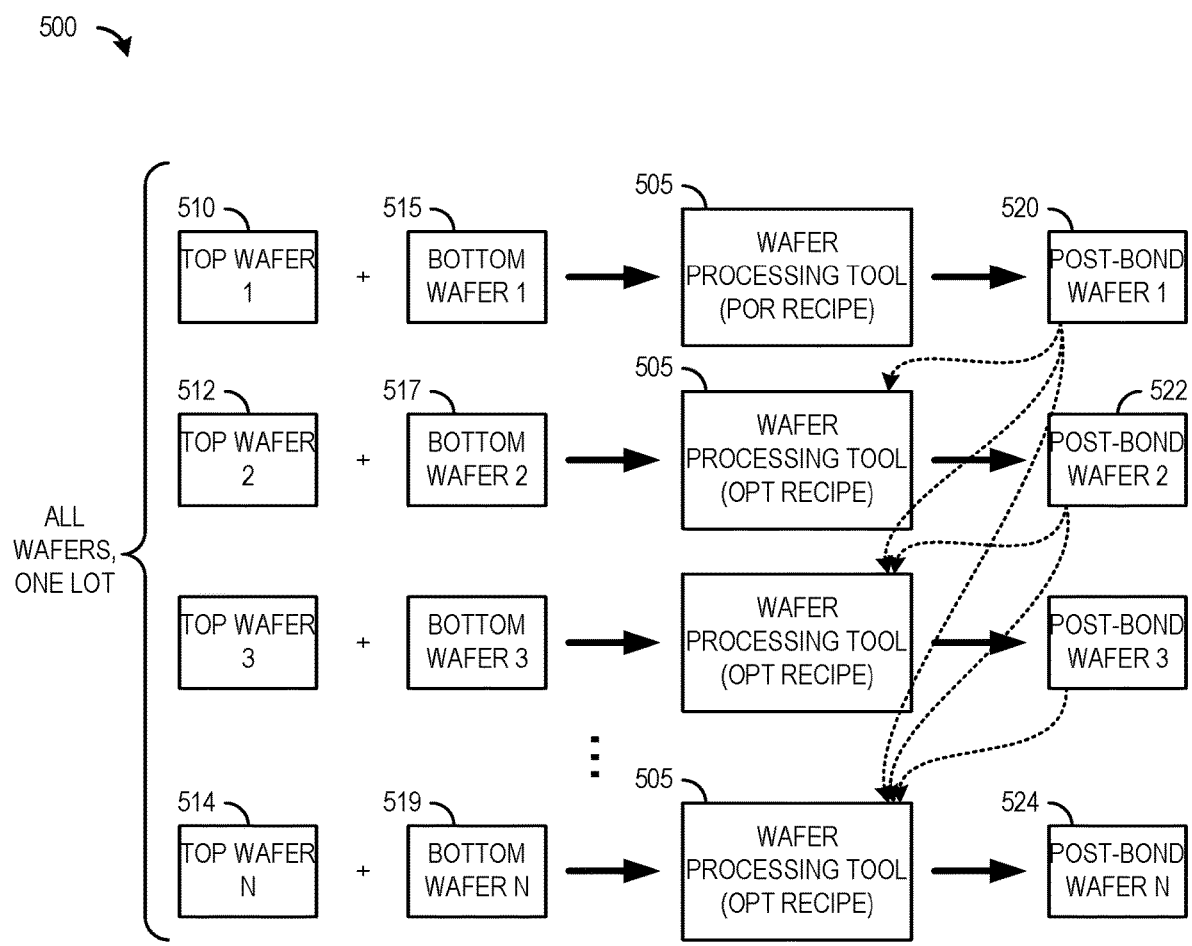
FIG. 5 illustrates a wafer fusion bonding process with example feedback operation according to example embodiments presented herein.

FIG. 5 illustrates a wafer fusion bonding process 500 with example feedback operation according to example embodiments presented herein. As shown in FIG. 5, a wafer processing tool 505 fusion bonds a first top wafer 510 and a first bottom wafer 515 using a POR wafer bonding recipe to form a first post-bond wafer 520. Distortion data of first post-bond wafer 520 (as measured by a scanner, for example) is provided to wafer processing tool 505 to optimize the wafer bonding recipe (shown in FIG. 5 as "OPT RECIPE"). Subsequent top wafers (e.g., second top wafer 512 and N-th top wafer 514) are bonded to subsequent bottom wafers (e.g., second bottom wafer 517 and N-th bottom wafer 519) in accordance with the optimized wafer bonding recipe to produce subsequent post-bond wafers (e.g., second post-bond wafer 522 and N-th post-bond wafer 524). In situations where the subsequent wafers are part of the same lot as the corresponding first wafers, wafer fusion bonding process 500 with feedback operation may be capable of producing post-bond wafers with a wafer bonding recipe optimized for the relatively small variations seen in same lot wafers.

In an embodiment, distortion data of the subsequent post-bond wafers, such as second post-bond wafer 522, may be measured and provided to wafer processing tool 505 to further optimize the wafer bonding recipe. As an example, the distortion data of second post-bond wafer 522 is measured and provided to wafer processing tool 505 to optimize the wafer bonding recipe used to bond a third post-bond wafer. Then, the distortion data of the third post-bond wafer is measured and provided to wafer processing tool 505 to optimize the wafer bonding recipe used to bond a fourth post-bond wafer, and so on.

In an embodiment, in a situation where multiple wafer processing tools are used to perform wafer fusion bonding, the distortion data of first post-bond wafer 520 is provided to the multiple wafer processing tools to separately optimize the wafer bonding recipe. In another embodiment, in a situation where multiple wafer processing tools are used to perform wafer fusion bonding, the optimized wafer bonding recipe is shared between the multiple wafer processing tools.

Figure 6:
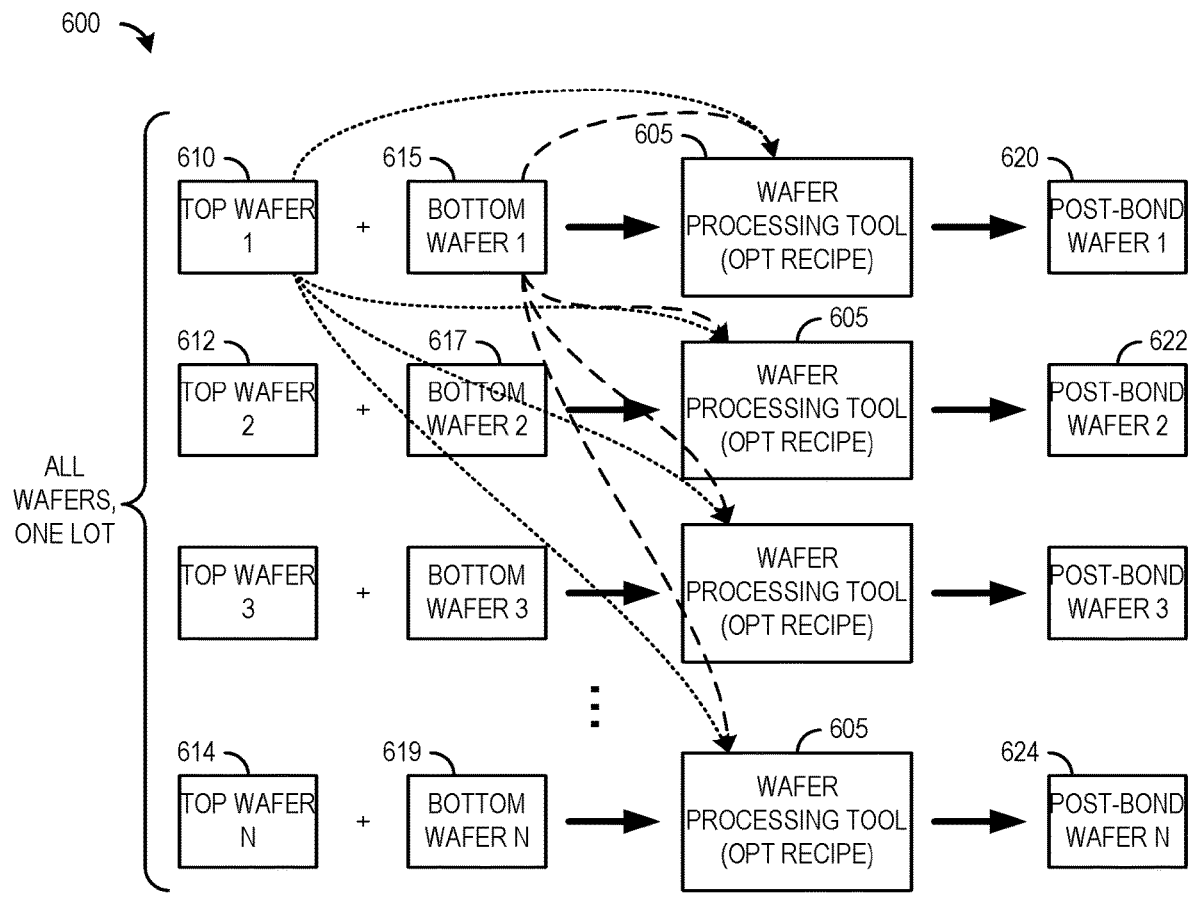
FIG. 6 illustrates a wafer fusion bonding process with a first example feedforward operation according to example embodiments presented herein.

FIG. 6 illustrates a wafer fusion bonding process 600 with a first example feedforward operation according to example embodiments presented herein. As shown in FIG. 6, a wafer processing tool 605 uses physical parameters of a first top wafer 610 and a first bottom wafer 615 to optimize the wafer bonding recipe (shown in FIG. 6 as "OPT RECIPE"). Wafer processing tool 605 uses the optimized wafer bonding recipe to bond first top wafer 610 and first bottom wafer 615 to form first post-bond wafer 620. The physical parameters of first top wafer 610 and first bottom wafer 615 may be measured before they are used to optimize the wafer bonding recipe to maximize the time available to optimize the wafer bonding recipe. As an example, the physical parameter measurements are made as the wafers are received at the wafer fabrication facility (potentially a significant amount of time before they are actually bonded) and the measurements are stored in a database. As another example, the physical parameter measurements are made as the wafers are loaded into the wafer bonding tool and the measurements are stored in a database. In an embodiment, subsequent top wafers (e.g., second top wafer 612 and N-th top wafer 614) are bonded to subsequent bottom wafers (e.g., second bottom wafer 617 and N-th bottom wafer 619) in accordance with the optimized wafer bonding recipe to produce subsequent post-bond wafers (e.g., second post-bond wafer 622 and N-th post-bond wafer 624). An advantage of wafer fusion bonding process 600 is that (within a wafer lot) all of the wafers are bonded using a wafer bonding recipe optimized for the relatively small variations seen in same lot wafers.

In an embodiment, in a situation where one of the two pre-bond wafers is patterned (e.g., the top wafer is patterned and the bottom wafer is a carrier wafer or the bottom wafer is patterned and the top wafer is a carrier wafer), only the physical parameters of the patterned wafer is used to optimize the wafer bonding recipe. As an example, in the situation when the top wafer is patterned and the bottom wafer is a carrier wafer, wafer processing tool 605 uses the physical parameters of first top wafer 610 to optimize the wafer bonding recipe used to bond first top wafer 610 and first bottom wafer 615. As another example, in the situation when the bottom wafer is patterned and the top wafer is a carrier wafer, wafer processing tool 605 uses the physical parameters of first bottom wafer 615 to optimize the wafer bonding recipe used to bond first top wafer 610 and first bottom wafer 615.

In an embodiment, in a situation where multiple wafer processing tools are used to perform wafer fusion bonding, the physical parameters of first top wafer 610 and first bottom wafer 615 are provided to the multiple wafer processing tools to separately optimize the wafer bonding recipe. In another embodiment, in a situation where multiple wafer processing tools are used to perform wafer fusion bonding, the optimized wafer bonding recipe is shared between the multiple wafer processing tools.

Figure 7:
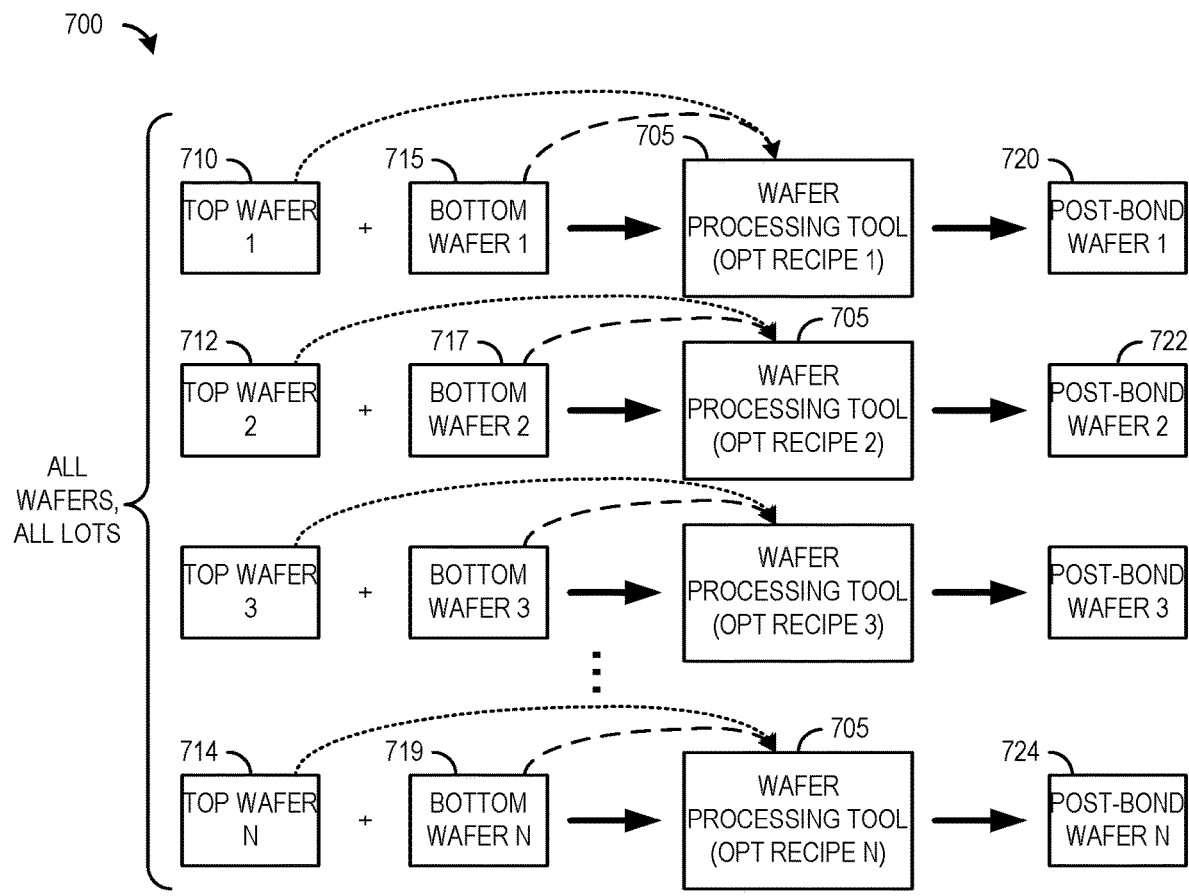
FIG. 7 illustrates a wafer fusion bonding process with a second example feedforward operation according to example embodiments presented herein.

FIG. 7 illustrates a wafer fusion bonding process 700 with a second example feedforward operation according to example embodiments presented herein. As shown in FIG. 7, a wafer processing tool 705 uses physical parameters of a first top wafer 710 and a first bottom wafer 715 to optimize the wafer bonding recipe (shown in FIG. 7 as "OPT RECIPE 1"). Wafer processing tool 705 uses the optimized wafer bonding recipe to bond first top wafer 710 and first bottom wafer 715 to form first post-bond wafer 720. The physical parameters of first top wafer 710 and first bottom wafer 715 may be measured before they are used to optimize the wafer bonding recipe to maximize the time available to optimize the wafer bonding recipe. As an example, the physical parameter measurements are made as the wafers are received at the wafer fabrication facility (potentially a significant amount of time before they are actually bonded) and the measurements are stored in a database. As another example, the physical parameter measurements are made as the wafers are loaded into the wafer bonding tool and the measurements are stored in a database. Physical parameters of subsequent top wafers and subsequent bottom wafers are used to optimize wafer bonding recipes used to bond subsequent post-bond wafers. As an example, physical parameters of second top wafer 712 and second bottom wafer 717 are used to optimize a wafer bonding recipe used to bond second post-bond wafer 722. Similarly, physical parameters of N-th top wafer 714 and N-th bottom wafer 719 are used to optimize a wafer bonding recipe used to bond N-th post-bond wafer 724. An advantage of wafer fusion bonding process 700 is that the wafer bonding recipe is individually optimized for the wafers being bonded, independent of wafer lot.

In an embodiment, in a situation where one of the two pre-bond wafers is patterned (e.g., the top wafer is patterned and the bottom wafer is a carrier wafer), only the physical parameters of the patterned wafer is used to optimize the wafer bonding recipe. As an example, wafer processing tool 705 uses the physical parameters of first top wafer 710 to optimize the wafer bonding recipe used to bond first top wafer 710 and first bottom wafer 715.

In an embodiment, a combination of feedforward and feedback optimization of the wafer bonding recipe is used. In such an embodiment, both the physical parameters of the pre-bond wafers and the distortion data of post-bond wafers are used to optimize the wafer bonding recipes.

Figure 8:
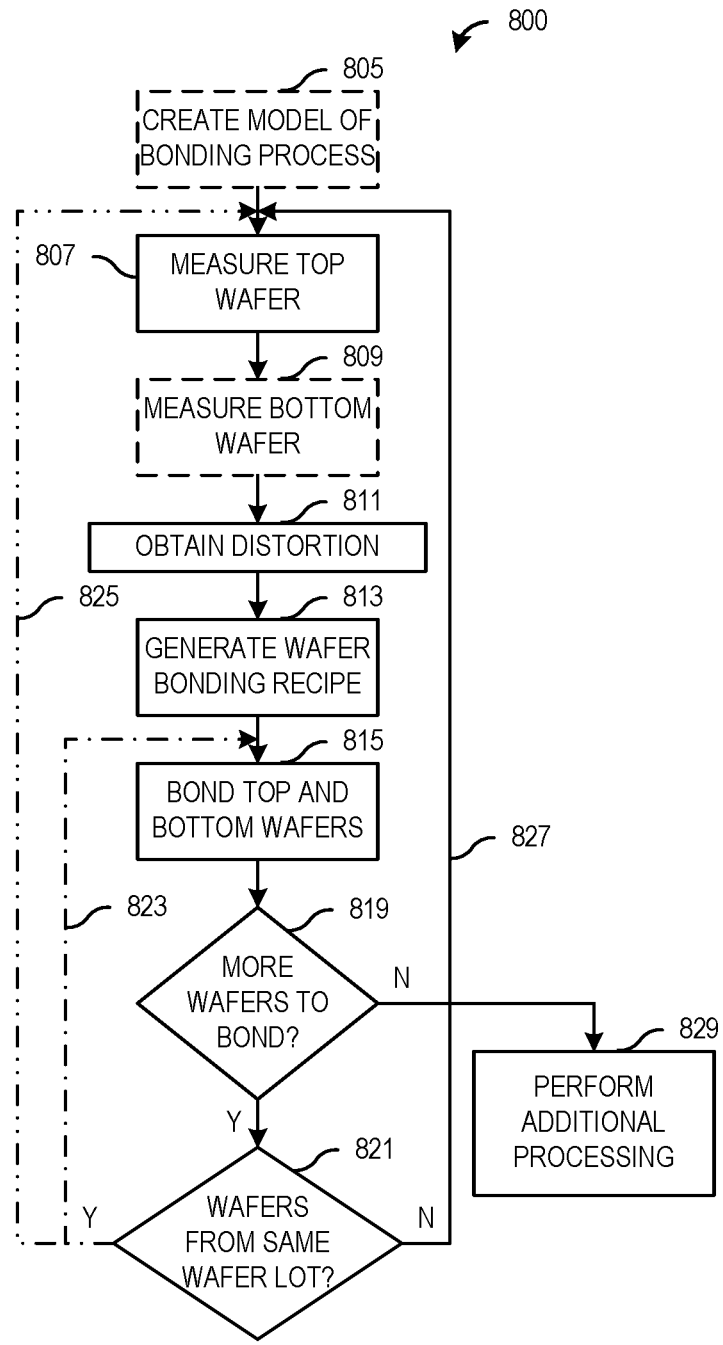
FIG. 8 illustrates a flow diagram of example operations occurring in a wafer bonding process with feedforward optimization of the wafer bonding recipe according to example embodiments presented herein.

FIG. 8 illustrates a flow diagram of example operations 800 occurring in a wafer bonding process with feedforward optimization of the wafer bonding recipe according to example embodiments presented herein. Operations 800 may be indicative of operations occurring in a wafer processing tool as the wafer processing tool bonds wafers using a wafer bonding process with feedforward optimization of the wafer bonding recipe. Operations 800 may be descriptive of wafer fusion bonding processes 600 and 700.

Operations 800 begin with the creating of a model of the wafer bonding process (block 805). The model of the wafer bonding process is a mathematical model of the wafer bonding process that takes into account physical parameters of the pre-bond wafers, as well as the process conditions of the wafer bonding process and relates them to simulated distortion of the post-bond wafers. The model of the wafer bonding process may utilize any combination of finite element analysis, linear regression, random forest algorithm, genetic programming algorithm, patterned search algorithm, neural network algorithm, deep learning algorithm, and so on, to relate the simulated distortion of the post-bond wafers to the physical parameters of the pre-bond wafers and the process conditions of the wafer bonding process. In an embodiment, the model is created a priori by a wafer processing tool and stored in a memory. In an embodiment, the model is created by a tool not directly involved in the bonding of wafers and then provided to the wafer processing tool. A detailed discussion of several approaches that may be used to create the model is provided below.

The process conditions of the wafer bonding process may include pre-clean time, pre-clean solution chemical composition, temperature of the top wafer chuck, temperature of the bottom wafer chuck, plasma pre-treatment time, plasma pre-treatment power, wafer idle time, bonding time, bond initiation force, chamber atmospheric pressure, chamber mean temperature, chamber humidity, chamber atmospheric gas composition, bottom wafer chuck vacuum pressures, bottom wafer chuck vacuum zones, bottom wafer chuck vacuum on/off time, top wafer chuck vacuum pressures, top wafer chuck vacuum zones, top wafer chuck vacuum on/off time, top wafer chuck height variation, bottom wafer chuck height variation, bonding gap, pre-chuck wafer temperature, chuck height, etc. The model of the wafer bonding process may consider any or all of the process conditions listed above.

The wafer processing tool measures an incoming top wafer (block 807). The wafer processing tool may measure the top wafer using any of a variety of metrology tools, such as a surface profilometer, and so on, or a scanner. The measurement of the top wafer provides physical parameters (such as wafer shape data) of the top wafer. The wafer processing tool optionally measures an incoming bottom wafer (block 809). The measuring of the incoming bottom wafer may follow a process similar to the measuring of the top wafer described above. In a situation where the incoming bottom wafer is a carrier wafer (i.e., the bottom wafer is unpatterned), the impact of the physical parameters of the bottom wafer on the distortion of the post-bond wafer may be insignificant compared to the impact of the patterned wafer (e.g., the incoming top wafer). Hence, it may be unnecessary to measure the bottom wafer. However, if both wafers are patterned, then the incoming bottom wafer should be measured. The distortions of the incoming wafers are also obtained from the measurements of the incoming wafers (block 811). The distortions of the wafers may be obtained using the same technique used during the creation of the model of the wafer bonding process, for example. Fingerprint coefficients may also be obtained for the wafers, using the same technique described in detail below for creating the model of the wafer bonding process, for example.

The wafer bonding recipe for bonding the incoming top wafer and the incoming bottom wafer is generated (block 813). The wafer bonding recipe is generated in accordance with the physical parameters of the incoming top wafer and the incoming bottom wafer (optional) and a post-bond distortion threshold for the post-bond wafer. The wafer bonding recipe is generated using the model of the wafer bonding process, as created in block 805, for example. In an embodiment, the wafer bonding recipe is generated by optimizing the wafer bonding recipe based on the physical parameters of the incoming top wafer and the incoming bottom wafer (optional), and the process conditions of an initial wafer bonding recipe (e.g., the POR wafer bonding recipe for the wafer bonding process). As an example, the wafer bonding recipe is optimized by tuning the process conditions until the estimated post-bond distortion is reduced to the point where the estimated post-bond distortion is less than a post-bond distortion threshold. The optimization algorithm may be a linear programming algorithm, a genetic algorithm, random forest algorithm, a regression algorithm, or other techniques.

The optimized wafer bonding recipe comprising the optimized process conditions are the instructions for the wafer processing tool to perform the wafer bonding process for the incoming pre-bond wafer pair. The optimized process conditions may include pre-clean time, pre-clean solution chemical composition, temperature of the top wafer chuck, temperature of the bottom wafer chuck, plasma pre-treatment time, plasma pre-treatment power, wafer idle time, bonding time, bond initiation force, chamber atmospheric pressure, chamber mean temperature, chamber humidity, chamber atmospheric gas composition, bottom wafer chuck vacuum pressures, bottom wafer chuck vacuum zones, bottom wafer chuck vacuum on/off time, top wafer chuck vacuum pressures, top wafer chuck vacuum zones, top wafer chuck vacuum on/off time, top wafer chuck height variation, bottom wafer chuck height variation, bonding gap, pre-chuck wafer temperature, chuck height, etc.

In an embodiment, the model of the wafer bonding process, with the physical parameters of the incoming top wafer and the incoming bottom wafer (optional) and an initial wafer bonding recipe (e.g., the POR wafer bonding recipe), is used to estimate the post-bond distortion of the post-bond wafer. If the estimated post-bond distortion meets the post-bond distortion threshold, the initial wafer bonding recipe is selected as the wafer bonding recipe for bonding the incoming top wafer and the incoming bonding wafer. If the estimated post-bond distortion does not meet the post-bond distortion threshold, the wafer processing tool changes one or more process conditions of the wafer bonding recipe and re-estimates the post-bond distortion. In an iterative process, wafer processing tool may continue to change process conditions until the estimated post-bond distortion meets the post-bond distortion threshold (or until a specified number of iterations is met, for example).

In an embodiment, a first wafer bonding recipe that results in an estimated post-bond distortion meeting the post-bond distortion threshold is the wafer bonding recipe used to bond the incoming wafers. In an embodiment, in a situation where a plurality of wafer bonding recipes result in estimated post-bond distortions that meet the post-bond distortion threshold, then the wafer bonding recipe out of the plurality of wafer bonding recipes with a smallest number of process condition changes (or a smallest amount of change to the process conditions, a process condition change easiest to implement, etc.) is the wafer bonding recipe used to bond the incoming wafers. As an example, if the estimated post-bond distortion for two wafer bonding recipes are about equal, then the wafer bonding recipe with changes to the process conditions that are the easiest to implement (e.g., smallest number of changes, smallest amount of changes, changes to more readily changeable process conditions, and so on) is the wafer bonding recipe used to bond the incoming wafers.

The wafer processing tool bonds the incoming top wafer and the incoming bottom wafer (block 815). The wafer processing tool bonds the incoming wafers using the wafer bonding recipe generated in block 813, for example.

A check is performed to determine if there are more wafers to bond (block 819). If there are additional wafers to bond, then another check is performed to determine if the additional wafers are from the same wafer lot as the wafers previously bonded (block 821). The same lot comparison may be performed by comparing the wafer lot associated with the wafer bonding recipe generated in block 813 with the wafer lot of an incoming wafer pair, for example. This check may be useful in determining if the wafer bonding recipe should be re-optimized. As discussed previously, intra-lot variation is significantly smaller than inter-lot variation. If the additional wafers are from the same wafer lot, then it may not be necessary to re-optimize the wafer bonding recipe. If there are no additional wafers to bond, the wafer processing tool may stop the wafer bonding process and potentially perform additional processing on the post-bond wafers (block 829). Additional processing of the post-bond wafers may include annealing the post-bond wafers, which involves holding the post-bond wafers at an elevated temperature for a specified amount of time to strengthen the bond between the wafers of the post-bond wafers.

If the additional wafers are from the same wafer lot, then the same wafer bonding recipe generated in block 813 may be used to bond the additional wafers. The wafer processing tool returns to block 815 bond another pair of incoming wafers (shown as dot-dashed line 823). The wafer processing tool uses the same wafer bonding recipe to bond this pair of incoming wafers. The operations illustrated when the wafer processing tool returns to block 815 to bond another pair of incoming wafers without making measurements of the pair of incoming wafers or potentially updating the wafer bonding recipe is an example of the wafer fusion bonding process illustrated in FIG. 6.

Although re-optimization of the wafer bonding recipe may not be required for same lot wafers, it is still possible to re-optimize the wafer bonding recipe for each incoming wafer pair. In such a situation, the wafer processing tool returns to block 807 to measure the incoming wafers, obtain distortions, generate another wafer bonding recipe, and bond the incoming wafers (shown as double-dot-dashed line 825). The operations illustrated when the wafer processing tool returns to block 807 to bond another pair of incoming wafers with making measurements of the pair of incoming wafers and potentially updating the wafer bonding recipe is an example of the wafer fusion bonding process illustrated in FIG. 7. As one practical implementation, the wafer measurements may be performed for each wafer pair before the wafers enters the wafer processing tool, for example, when or before undergoing prior steps. This may provide additional time for generating the optimized process recipe. In such cases, the model may include corrections to offset additional distortions to be introduced by the to be performed processing steps.

If the additional wafers are not from the same wafer lot, then the same wafer bonding recipe generated in block 813 may not be able to bond wafers with post-bond distortions that meet the post-bond distortion threshold. The wafer bonding recipe should be regenerated with the physical parameters of the additional wafers. The wafer processing tool returns to block 807 to measure the incoming wafers, obtain distortions, generate another wafer bonding recipe, and bond the incoming wafers (shown as solid line 827).

In an embodiment, measurements of the post-bond wafers that are bonded utilizing the optimized wafer bonding recipe are used to refine the model of the wafer bonding process to help improve the estimation accuracy of the model. The refinement of the model may follow the techniques illustrated in FIG. 9 or 10 or some other technique.

Figure 9A:
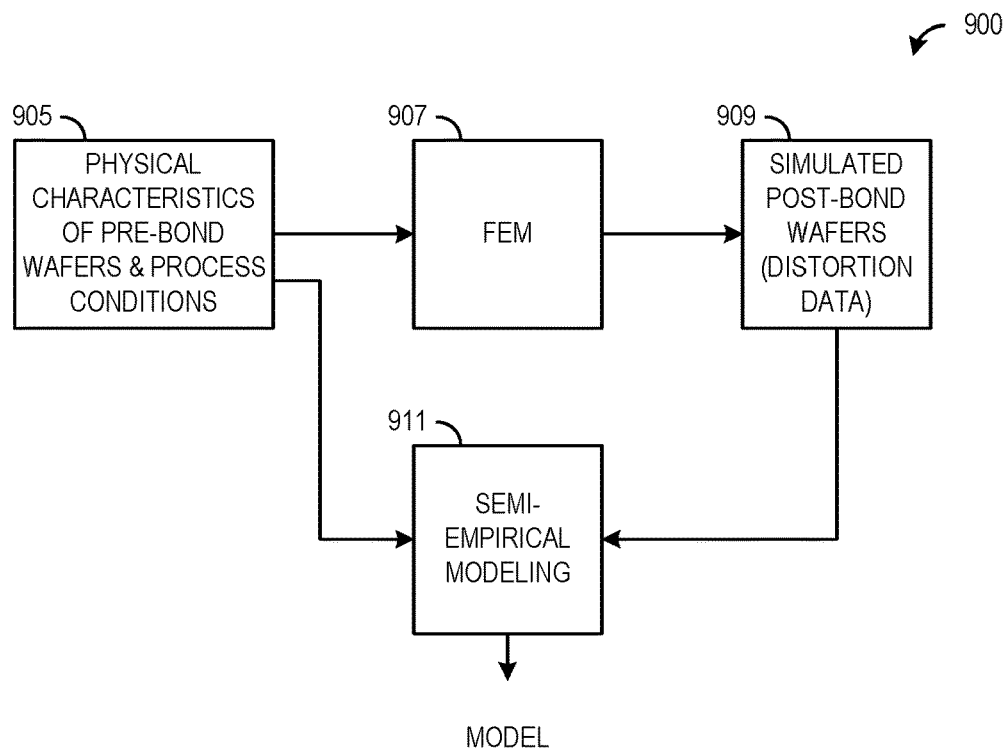
FIG. 9A illustrates a flow diagram of first example process creating a model of a wafer bonding process using a finite element modeling (FEM) technique enhanced with semi-empirical modeling according to example embodiments presented herein.

FIG. 9A illustrates a flow diagram of first example process 900 in creating a model of a wafer bonding process using a finite element modeling (FEM) technique enhanced with semi-empirical modeling according to example embodiments presented herein. Process 900 may be indicative of operations occurring in a tool, such as a wafer processing tool or a tool dedicated to model creation, as the tool creates the model of the wafer bonding process using FEM techniques enhanced with semi-empirical modeling. In an embodiment, the FEM techniques are used to simulate the wafer bonding process over a wide range of incoming wafer physical characteristics and wafer bonding recipe process conditions. For example, wafers with different shape profiles may be simulated to obtain certain patterns and/or behavior that can then be represented in the model of the wafer bonding process. The FEM simulation typically solves a stress-strain equation using a 2-D (two dimensional) or 3-D (three dimensional) representation of the wafer using a finite element analysis technique. As one practical implementation, the wafer measurements may be performed for each wafer pair before the wafers enter the wafer processing tool, for example, when or before undergoing prior steps. This may provide additional time for generating the optimized process recipe. In such cases, the model may include corrections to offset additional distortions to be introduced by the to be performed processing steps. In addition, the FEM simulation in parallel may also simulate other physical processes that change the stress-strain of the system during the wafer bonding process. Some examples include reactions within the wafer, reflow of materials that change the stress, outgassing from different material layers within the wafer, and so forth.

In an embodiment, semi-empirical modeling is utilized to create and refine a model using data generated using the FEM techniques. Process 900 may be an example implementation of block 805 of FIG. 8.

Process 900 begins with physical characteristics of pre-bond wafers and process conditions of a wafer bonding recipe (block 905). The physical characteristics of the pre-bond wafers and the process conditions of the wafer bonding recipe may be inputs to a simulation of the wafer bonding process. The input is provided to a FEM simulation of the physics involved in the wafer bonding process (block 907). The FEM simulation produces simulated post-bond wafers based on the input (i.e., the physical characteristics of the pre-bond wafers and the process conditions of the wafer bonding recipe such as applied pressure and temperature, etc.). The FEM simulation produces simulated post-bond wafers (block 907). The simulated distortion data of the simulated post-bond wafers may be determined.

FEM simulation is able to simulate the output (i.e., the distortion data of the post-bond wafers) from the input (i.e., the physical characteristics of the pre-bond wafers and the process conditions of the wafer bonding recipe such as applied pressure and temperature) using the physics involved in wafer bonding, FEM simulation may be computationally intensive. Therefore, while FEM simulation may be directly used in actual wafer bonding deployments, certain embodiments may use a semi-empirical model. In an embodiment, semi-empirical modeling is used to help reduce the computational requirements associated with the creation of the model of the wafer bonding process.

The input and the output may be provided to a semi-empirical modeling process (block 911). The inputs may be for wide range of pre-bond wafers and wafer lots, as well as a range of process conditions or wafer bonding recipes, while the outputs comprise simulated distortion data of simulated post-bond wafers bonded in accordance with the inputs. The semi-empirical modeling process is used to determine relationships between the inputs and the outputs. In other words, the semi-empirical modeling process utilizes empirical data (the inputs and the outputs) to develop a model of the wafer bonding process. The semi-empirical modeling process outputs the model of the wafer bonding process. The semi-empirical modeling process may use any of a variety of techniques, such as optimization techniques, searching techniques, annealing techniques, machine learning techniques (including but not limited to neural network techniques, deep learning techniques, regression techniques, classification techniques, clustering techniques, dimensionality reduction techniques, ensemble methods, transfer learning techniques, reinforcement learning techniques, and so on), etc.

In an embodiment, actual data (e.g., actual physical characteristics of pre-bond wafers, process conditions of wafer bonding recipes, and actual distortion of post-bond wafers bonded using the wafer bonding recipes) is also provided to the semi-empirical modeling process to help further refine the model of the wafer bonding process.

Figure 9B:
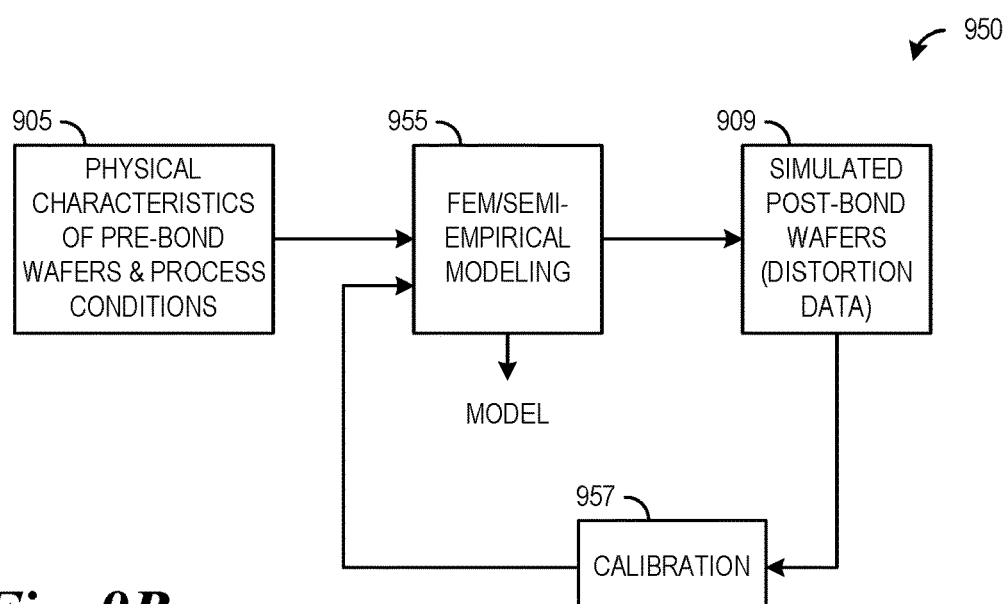
FIG. 9B illustrates a flow diagram of second example process in creating a model of a wafer bonding process using FEM techniques enhanced with semi-empirical modeling and calibration according to example embodiments presented herein.

FIG. 9B illustrates a flow diagram of second example process 950 in creating a model of a wafer bonding process using FEM techniques enhanced with semi-empirical modeling and calibration according to example embodiments presented herein. Calibration may help to refine the model to account for parameters that may be difficult to account in a FEM simulation, for example, a pre-clean time or time over which the wafer are held together in block 815 prior to annealing or the anneal time. In addition, many of the process knobs may be modeled similarly, e.g., top wafer chuck position and bottom wafer chuck position may be independently controlled but may be modelled similarly as a physical model only uses the relative distances. Therefore, a calibration may be necessary to tie the various process conditions with the model.

Further, while the calibration is described below with respect to the semi-empirical modeling, a similar approach may be used if the FEM simulation is directly used without the semi-empirical model.

Process 950 may be indicative of operations occurring in a tool, such as a wafer processing tool or a tool dedicated to model creation, as the tool creates the model of the wafer bonding process using FEM techniques enhanced with semi-empirical modeling. In addition, calibration may be used to determine the contribution and impact of different process parameters on the model of the wafer bonding process. Process 950 may be an example implementation of block 805 of FIG. 8.

As shown in FIG. 9B, a model of the wafer bonding process is created using FEM techniques enhanced with semi-empirical modeling (block 955). The model may be created based on physical characteristics of pre-bond wafers and process conditions of wafer bonding recipes. Process 900 of FIG. 9A may be an example of block 955.

After the model has been created, or as the model is being created, calibration may be performed (block 957). Calibration may involve setting one or more process conditions of the wafer bonding recipe to predetermined values and then simulating the outputs in accordance to the calibrated process conditions. Calibration may be used to determine the impact or contribution of individual process conditions on the distortion of the post-bond wafer. As an example, one process condition is changed with the remainder of the process conditions held constant, and the resulting post-bond wafer is simulated using the process conditions. The model of the wafer bonding process may be refined in accordance with the simulated results.

Figure 10:
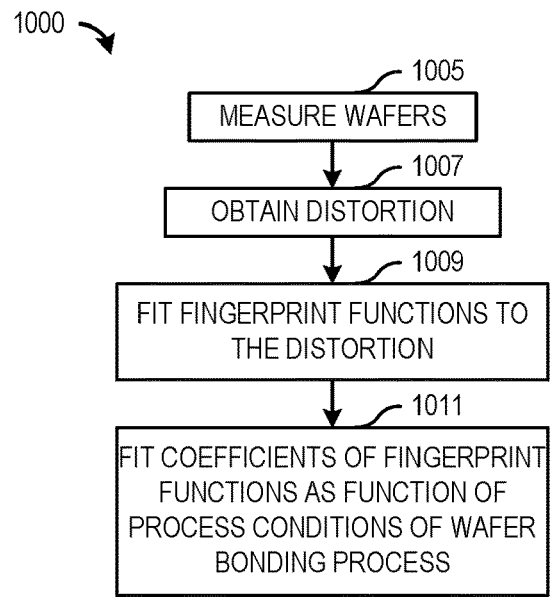
FIG. 10 illustrates a flow diagram of example operations occurring in creating a model of a wafer bonding process using fingerprinting functions according to example embodiments presented herein.

FIG. 10 illustrates a flow diagram of example operations 1000 occurring in creating a model of a wafer bonding process using fingerprinting functions according to example embodiments presented herein. Operations 1000 may be indicative of operations occurring in a tool, such as a wafer processing tool or a tool dedicated to model creation, as the tool creates the model of the wafer bonding process using fingerprinting functions. Operations 1000 may be an example implementation of block 805 of FIG. 8.

Operations 1000 begin with the measuring of wafer to obtain physical parameters (block 1005). The wafers measured include pre-bond wafers (i.e., the top wafers and the bottom wafers). The wafers may be measured using a metrology tool (such as a surface profilometer, a scanner, and so on). In a situation where both the top and bottom wafers are patterned, both wafers should be measured. In a situation where only one wafer is patterned, it may not be necessary to measure the unpatterned wafer. Measurements are made for a plurality of pre-bond wafers. As an example, top and bottom wafers from different lots are measured. Distortions are obtained from the measurements of the wafers (block 1007). The distortions may be derived from the measurements of the wafers through geometric calculations, for example.

Fingerprinting functions are fitted to the distortions (block 1009). In general, fingerprinting functions are mathematical models of a respective metric that retains spatial information of the measurements. The fitting of the fingerprinting functions to the distortions may involve an analysis (such as a regression analysis) to select and adjust the parameters of the fingerprinting functions to fit the distortions within a specified threshold. As an example, the distortions may be expressed mathematically as a finite series of fingerprinting functions, such as polynomials (e.g., Zernike polynomials) or functions (such as, Fourier series or Bessel function). Each polynomial or function is weighed by a respective coefficient that are the fitting parameters that may be adjust to fit the distortions. The fitted coefficients represent unique tendencies of the distortion for a particular wafer. In an embodiment, the fingerprinting functions are fitted to the distortions of the wafers (e.g., the pre-bond wafers and the post-bond wafers).

The fitted coefficients of the fingerprinting functions are fitted as function of process conditions of the wafer bonding process (block 1011). The model of the wafer bonding process may be created by fitting the fitted coefficients of the fingerprinting functions as a function of the process conditions of the wafer bonding process used to bond the wafers, as well as the distortion of the pre-bond wafers (which are also converted into fingerprinting coefficients). The function may be linear, quadratic, exponential, or other nonlinear forms, with one or more of the process conditions discussed previously. The function may also include terms where two or more of the process conditions interact with each other in linear, quadratic, exponential, or other nonlinear form, ways. The exact format of the function may be determined through a computer algorithm, for example linear regression, random forest, genetic programming, pattern search, neural network, deep learning, etc. The model is constructed so that the post-bond wafer distortion can be estimated by using any process conditions that is within the limits of the database, and the pre-bond wafer physical parameters. The ability of the model of the wafer bonding process to estimate the distortion of the post-bond wafer in accordance with the process conditions of the wafer bonding process and the characteristics of the pre-bond wafers enables the optimization of the wafer bonding recipe before the bonding of the pre-bond wafer pair. A detailed description of fingerprinting functions and examples of their use is provided in co-assigned U.S. patent application Ser. No. 16/666,087, entitled "Systems and Methods for Manufacturing Microelectronic Devices," filed Oct. 28, 2019, which is hereby incorporated by reference in its entirety.

Figure 11:
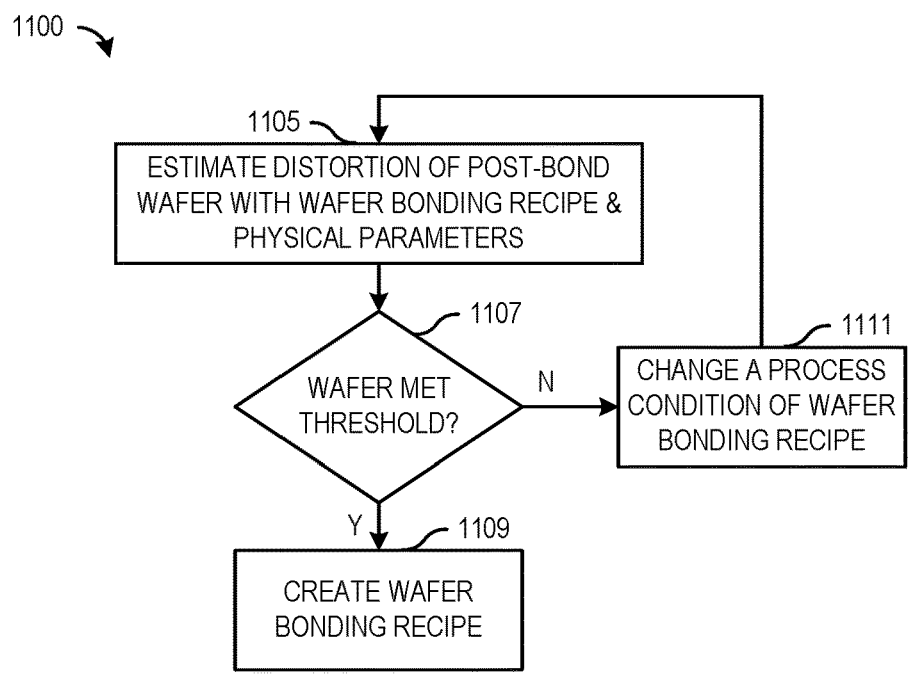
FIG. 11 illustrates a flow diagram of operations occurring in a generation of a wafer bonding recipe with feedforward based optimization of the wafer bonding recipe according to example embodiments presented herein.

FIG. 11 illustrates a flow diagram of operations 1100 occurring in a generation of a wafer bonding recipe with feedforward based optimization of the wafer bonding recipe according to example embodiments presented herein. Operations 1100 may be indicative of operations occurring in a wafer processing tool as the wafer processing tool generates a wafer bonding recipe with feedforward based optimization of the wafer bonding recipe. Operations 1100 may be an example implementation of block 813 of FIG. 8.

Operations 1100 begin with the model in block 805 of the wafer processing tool estimating the post-bond distortion of a post-bond wafer that is bonded using an initial wafer bonding recipe (block 1105). The post-bond distortion of the post-bond wafer is estimated using the physical parameters of the incoming wafers and the process conditions for the initial wafer bonding recipe (e.g., the POR wafer bonding recipe) as described in blocks 807, 809, 811 of FIG. 8.

A check is performed to determine if the estimated post-bond distortion of the post-bond wafer meets the post-bond distortion threshold (block 1107). If the estimated post-bond distortion meets the post-bond distortion threshold, then the wafer processing tool creates the wafer bonding recipe (block 1109). The wafer bonding recipe is created from the process condition of wafer bonding recipe used in the estimation of block 1105. The wafer bonding recipe includes any changes to the process conditions of the initial wafer bonding recipe.

If the estimated post-bond distortion of the post-bond wafer does not meet the post-bond distortion threshold, a change is made to one or more process conditions of the wafer bonding recipe (block 1111). A selection of the one or more process conditions may be based on factors such as how far the estimated post-bond distortion is away from meeting the post-bond distortion threshold, impact of a process condition on the post-bond distortion, ease of changing a process condition, and so forth. As an example, if the estimated post-bond distortion is close to meeting the post-bond distortion threshold, the one or more process conditions changed may be process conditions that are easy to change and have been shown to have change the estimated post-bond distortion in a fine grained manner, while if the estimated post-bond distortion is far from meeting the post-bond distortion threshold, the one or more process conditions changed may process conditions that have been shown to have coarse grained changes to the estimated post-bond distortion (to potentially reduce a number of times the wafer bonding recipe is changed before the estimated post-bond distortion meets the post-bond distortion threshold, for example). As another example, some process conditions are easier to change. For example, wafer chuck temperature may be easier to change than pre-clean solution chemical composition. Therefore, such process conditions are more feasible candidates for changing.

Example changes to the wafer bonding recipe may include changes to any one or more of the following process conditions: pre-clean time, pre-clean solution chemical composition, temperature of the top wafer chuck, temperature of the bottom wafer chuck, plasma pre-treatment time, plasma pre-treatment power, wafer idle time, bonding time, bond initiation force, chamber atmospheric pressure, chamber mean temperature, chamber humidity, chamber atmospheric gas composition, bottom wafer chuck vacuum pressures, bottom wafer chuck vacuum zones, bottom wafer chuck vacuum on/off time, top wafer chuck vacuum pressures, top wafer chuck vacuum zones, top wafer chuck vacuum on/off time, top wafer chuck height variation, bottom wafer chuck height variation, bonding gap, pre-chuck wafer temperature, chuck height, and so forth. The wafer processing tool returns to block 1105 to re-estimate the post-bond distortion of the post-bond wafer bonded in accordance with the changed wafer bonding recipe.

Figure 12:
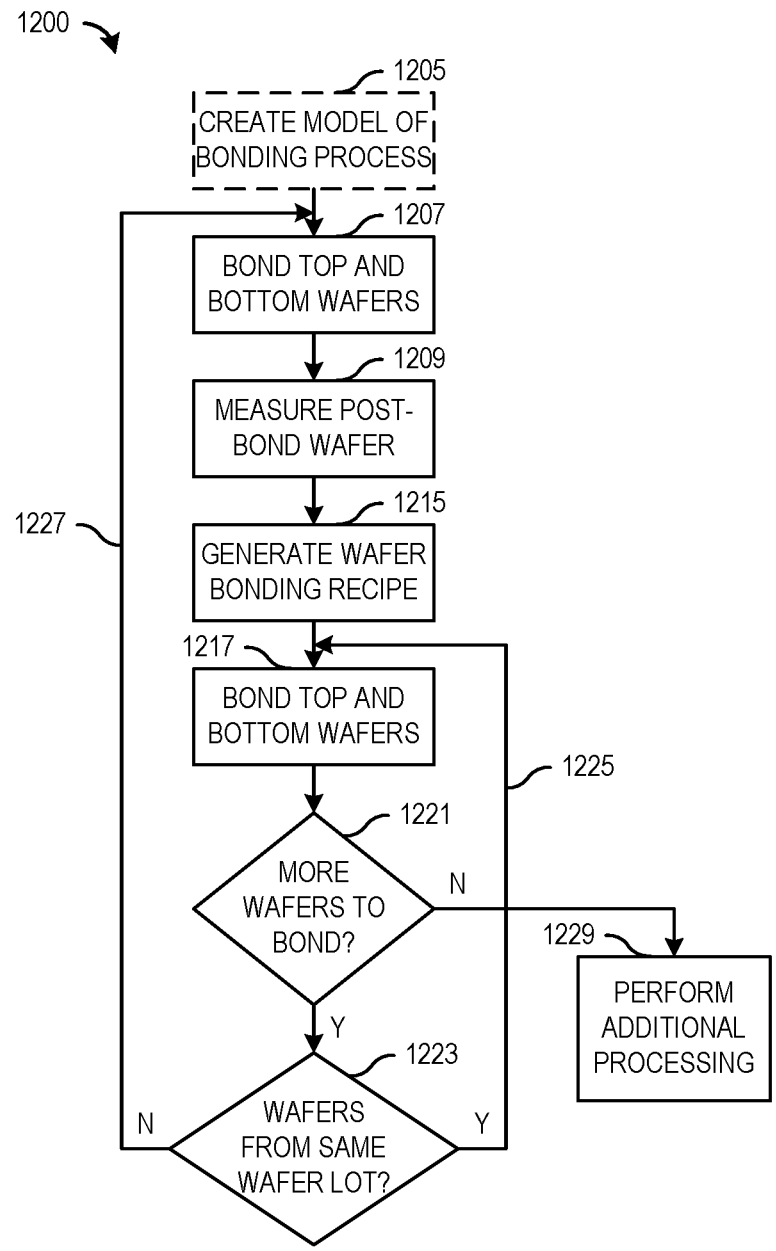
FIG. 12 illustrates a flow diagram of example operations occurring in a wafer bonding process with feedback optimization of the wafer boding recipe according to example embodiments presented herein.

FIG. 12 illustrates a flow diagram of example operations 1200 occurring in a wafer bonding process with feedback optimization of the wafer boding recipe according to example embodiments presented herein. Operations 1200 may be indicative of operations occurring in a wafer processing tool as the wafer processing tool bonds wafers using a wafer bonding process with feedback optimization of the wafer bonding recipe. Operations 1200 may be descriptive of wafer fusion bonding process 500.

Operations 1200 begin with the creating of a model of the wafer bonding process (block 1205). The model of the wafer bonding process may be created based on measurements of post-bond wafers and process conditions of the wafer bonding recipes. The model of the wafer bonding process may utilize any combination of finite element analysis, linear regression, random forest algorithm, genetic programming algorithm, patterned search algorithm, neural network algorithm, deep learning algorithm, and so on, to relate the distortion of the post-bond wafers to the process conditions of the wafer bonding recipes. In an embodiment, the model is created a priori by a wafer processing tool and stored in a memory. In an embodiment, the model is created by a tool not directly involved in the bonding of wafers and then provided to the wafer processing tool. A detailed discussion of an example approach that may be used to create the model is provided below.

The wafer processing tool bonds the incoming top wafer and the incoming bottom wafer (block 1207). In an embodiment, the wafer processing tool bonds the incoming top and bottom wafers using a POR wafer bonding recipe, for example. In another embodiment, the wafer processing tool bonds the incoming top and bottom wafers using a most recent wafer bonding recipe used for bonding wafers of the same design. The wafers being bonded may be from the same lot or from different lots of wafers bonded using the most recent wafer bonding recipe. The wafer processing tool measures the post-bond wafer (block 1209). As an example, distortions of the post-bond wafer are measured. The measurement of the post-bond wafer may be performed using a metrology tool, such as a scanner.

The wafer bonding recipe is generated (block 1215). The wafer bonding recipe is generated in accordance with the measurements (e.g., distortions) of the post-bond wafer. The wafer bonding recipe is generated using the model of the wafer bonding process, as created in block 1205, for example. In an embodiment, the wafer bonding recipe is generated by optimizing the wafer bonding recipe based on the distortions of the post-bond wafer, and the process conditions of an initial wafer bonding recipe (e.g., the POR wafer bonding recipe for the wafer bonding process). As an example, the wafer bonding recipe is optimized by tuning the process conditions until the estimated post-bond distortion is reduced to the point where the estimated post-bond distortion is less than a post-bond distortion threshold. The optimization algorithm may be a linear programming algorithm, a genetic algorithm, random forest algorithm, a regression algorithm, or other techniques.

The wafer processing tool bonds an incoming wafer pair (block 1217). The incoming wafer pair is bonded in accordance with the wafer bonding recipe generated in block 1215.

A check is performed to determine if there are more wafers to bond (block 1221). If there are additional wafers to bond, then another check is performed to determine if the additional wafers are from the same wafer lot as the wafers previously bonded (block 1223). The same lot comparison may be performed by comparing the wafer lot associated with the wafer bonding recipe generated in block 1215 with the wafer lot of an incoming wafer pair, for example. This check may be useful in determining if the wafer bonding recipe should be re-optimized. As discussed previously, intra-lot variation is significantly smaller than inter-lot variation.

If the additional wafers are from the same wafer lot, then it may not be necessary to re-optimize the wafer bonding recipe. In such a situation, the wafer processing tool returns to block 1217 to bond an incoming wafer pair (shown as line 1225). In an embodiment, even if the additional wafers are from the same wafer lot, the wafer bonding recipe may still be re-optimized. In this situation, the wafer processing tool returns to block 1209 to make measurements of the post-bond wafer and uses the measurements to generate the wafer bonding recipe in block 1215. If there are no additional wafers to bond, the wafer processing tool may stop the wafer bonding process and potentially perform additional processing on the post-bond wafers (block 1229). Additional processing of the post-bond wafers may include annealing the post-bond wafers, which involves holding the post-bond wafers at an elevated temperature for a specified amount of time to strengthen the bond between the wafers of the post-bond wafers.

If the additional wafers are from a different wafer lot, the wafer processing tool returns to block 1207 (shown as line 1227) to bond an initial pair of wafers from the different wafer lot. The post-bond wafer comprising the initial pair of wafers from the different wafer lot may be used to generate a new wafer bonding recipe usable in bonding remaining wafers from the different wafer lot.

In an embodiment, measurements of the post-bond wafers that are bonded utilizing the optimized wafer bonding recipe are used to refine the model of the wafer bonding process to help improve the estimation accuracy of the model.

Figure 13:
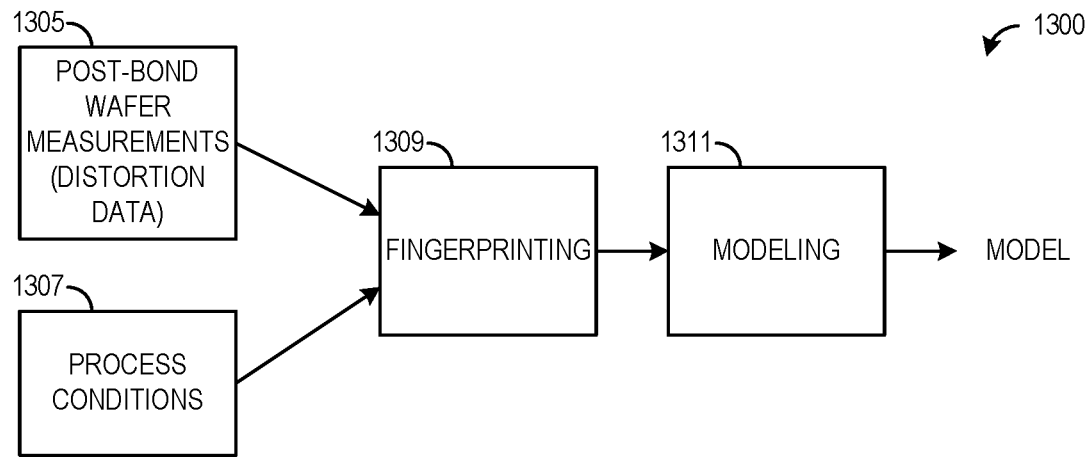
FIG. 13 illustrates a flow diagram of an example process in creating a model of a wafer bonding processing using feedback data according to example embodiments presented herein.

FIG. 13 illustrates a flow diagram of an example process 1300 in creating a model of a wafer bonding processing using feedback data according to example embodiments presented herein. Process 1300 may be indicative of operations occurring in a tool, such as a wafer processing tool or a tool dedicated to model creation, as the tool creates the model of the wafer bonding process using feedback data using feedback data. In an embodiment, fingerprinting functions are used in determining a relationship between distortion data of post-bond wafers and process conditions of wafer bonding recipes. The use of fingerprinting advantageously reduces the computational load to generate the optimized process recipe for each wafer. Process 1300 may be an example implementation of block 1205 of FIG. 12.

Process 1300 begins with inputs, such as measurements of post-bond wafers (block 1305) and process conditions of wafer bonding recipes (block 1307) being provided to a fingerprinting process (block 1309). The measurements, such as distortion measurements, of the post-bond wafers may be taken for post-bond wafers after they have been bonded (using a particular wafer bonding recipe) or after they have been annealed. The process conditions correspond to the wafer bonding recipes used to form the post-bond wafers. The fingerprinting process may include the fitting of fingerprinting functions to the distortion measurements. As discussed previously, fingerprinting functions are mathematical models of a respective metric that retains spatial information of the measurements. The fitted coefficients represent unique tendencies of the distortion for a particular post-bonded wafer. In an embodiment, the fingerprinting functions are fitted to the distortions of the post-bond wafers.

The fitted coefficients of the fingerprinting functions are provided to a modeling process to create the model of the wafer bonding process (block 1311). The fitted coefficients of the fingerprinting functions may be fitted as function of process conditions of the wafer bonding process. The model of the wafer bonding process may be created by fitting the fitted coefficients of the fingerprinting functions as a function of the process conditions of the wafer bonding process used to bond the wafers, as well as the distortion of the post-bond wafers. The function may be linear, quadratic, exponential, or other nonlinear forms, with one or more of the process conditions discussed previously. The function may also include terms where two or more of the process conditions interact with each other in linear, quadratic, exponential, or other nonlinear form, ways. The exact format of the function may be determined through a computer algorithm, for example linear regression, random forest, genetic programming, pattern search, neural network, deep learning, etc. The model is constructed so that the process conditions may be estimated by using any distortion of the post-bond wafers. The ability of the model of the wafer bonding process to estimate the process conditions in accordance with the distortion of the post-bond wafers enables the optimization of the wafer bonding recipe from the distortion measurements of the post-bond wafers.

Figure 14:
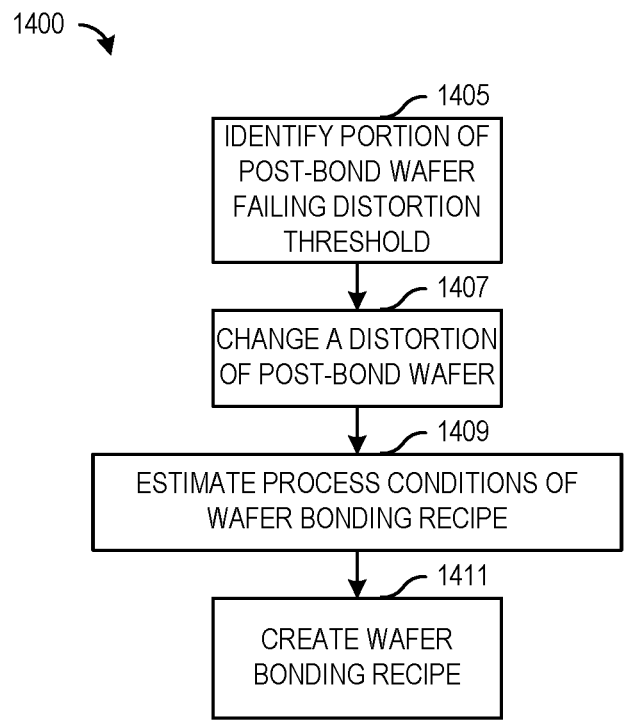
FIG. 14 illustrates a flow diagram of operations occurring in a generation of a wafer bonding recipe with feedback based optimization of the wafer bonding recipe according to example embodiments presented herein.

FIG. 14 illustrates a flow diagram of operations 1400 occurring in a generation of a wafer bonding recipe with feedback based optimization of the wafer bonding recipe according to example embodiments presented herein. Operations 1400 may be indicative of operations occurring in a wafer processing tool as the wafer processing tool generates a wafer bonding recipe with feedback based optimization of the wafer bonding recipe. Operations 1400 may be an implementation of block 1215 of FIG. 12.

Operations 1400 begin with the wafer processing tool identifying a portion of a post-bond wafer that fails to meet a post-bond wafer distortion threshold (block 1405). As an example, given a particular post-bond wafer, with distortion that fails to meet a post-bond wafer distortion threshold, the wafer processing tool determines one or more portions of the post-bond wafer with distortion measurements that fail to meet the post-bond wafer distortion threshold. In an embodiment, in a situation where there is a plurality of portions of the post-bond wafer that all fail the post-bond wafer distortion threshold, the wafer processing tool may identify a subset of the plurality, correct for that identified subset, and repeat for other subsets of the plurality until all of the plurality of portions of the post-bond wafer that all fail the post-bond wafer distortion threshold have been addressed.

The wafer processing tool makes a change to the distortion of the identified portion of the post-bond wafer (block 1407). In an embodiment, the wafer processing tool changes the distortion in only the identified portion of the post-bond wafer. In an embodiment, the wafer processing tool changes the distortion in not just the identified portion of the post-bond wafer, but in adjacent and, perhaps, nearby portions of the post-bond wafer, to make the change in the distortion continuous. The definition of "nearby portions" may be a configuration parameter for the wafer processing tool, potentially trading off optimization complexity for bonding performance.

The wafer processing tool estimates the process conditions of the wafer bonding recipe that would produce a post-bond wafer with the distortion measurements (block 1409). In other words, the wafer processing tool, using the model of the wafer bonding process, estimates the process conditions that would result in a post-bond wafer that would have a measured distortion that matches the changed distortion. The wafer processing tool creates the wafer bonding recipe from the estimated process conditions (block 1411).

Example 1. A method including: having a first wafer bonding recipe and a model of a wafer bonding process, the model including an input indicative of a physical parameter of a first wafer to be bonded to a second wafer and configured to output a wafer bonding recipe based, at least in part, on the physical parameter of the first wafer; obtaining measurements of the first wafer to obtain the physical parameter of the first wafer; generating, by the model, the first wafer bonding recipe based, at least in part, on the physical parameter of the first wafer; and bonding the first wafer to the second wafer in accordance with the first wafer bonding recipe to produce a first post-bond wafer.

Example 2. The method of example 1, further including annealing the first post-bond wafer to produce a fusion bonded wafer.

Example 3. The method of one of examples 1 or 2, where the physical parameter of the first wafer includes out-of-plane distortions of the first wafer.

Example 4. The method of one of examples 1 to 3, further including deriving the model of the wafer bonding process including: obtaining measurements of third wafer and fourth wafer to obtain a physical parameter of the third wafer and a physical parameter of the fourth wafer; simulating wafer bonding of the third wafers and the fourth wafers in accordance with process conditions to estimate a physical parameter of a simulated post-bond wafer; and creating the model of the wafer bonding process in accordance with the physical parameter of the third wafer, the physical parameter of the fourth wafer, the process conditions, and the estimated physical parameter of the simulated post-bond wafer.

Example 5. The method of one of examples 1 to 4, where creating the model of the wafer bonding process includes: comparing the physical parameter of the third wafer, the physical parameter of the fourth wafer, the process conditions, and the estimated physical parameter of the simulated post-bond wafer; and determining the model of the wafer bonding process in accordance with the comparison.

Example 6. The method of one of examples 1 to 5, where generating the first wafer bonding recipe includes: estimating, by the model, post-bond distortions of the first post-bond wafer in accordance with the physical parameter of the first wafer; tuning process conditions of the first wafer bonding recipe to optimize the estimated post-bond distortions of the first post-bond wafer; and generating the first wafer bonding recipe in accordance with the tuned process conditions.

Example 7. The method of one of examples 1 to 6, further including obtaining measurements of the second wafer to obtain a physical parameter of the second wafer, where the first wafer bonding recipe is further generated based on the physical parameter of the second wafer.

Example 8. The method of one of examples 1 to 7, further including bonding a third wafer to a fourth wafer in accordance with the first wafer bonding recipe to produce a second post-bond wafer.

Example 9. The method of one of examples 1 to 8, where the first wafer and the third wafer are part of a first wafer lot, and the second wafer and the fourth wafer are part of a second wafer lot, and where the first wafer lot and the second wafer lot are processed together in a semiconductor fabrication process flow.

Example 10. A method including: having a model of a wafer bonding process, the model including an input indicative of a physical parameter of a first post-bond wafer and configured to output a wafer bonding recipe based on the physical parameter of the first post-bond wafer; bonding a first wafer to a second wafer in accordance with a wafer bonding recipe, to form the first post-bond wafer; obtaining measurements of the first post-bond wafer to obtain the physical parameter of the first post-bond wafer; generating, by the model, the first wafer bonding recipe in accordance with the physical parameter of the first post-bond wafer; and bonding a third wafer to a fourth wafer in accordance with the first wafer bonding recipe, to form a second post-bond wafer.

Example 11. The method of example 10, further including annealing the first post-bond wafer to produce a first fusion bonded wafer; and annealing the second post-bond wafer to produce a second fusion bonded wafer.

Example 12. The method of one of examples 10 or 11, where obtaining measurements includes scanning the first post-bond wafer to obtain the physical parameter of the first post-bond wafer.

Example 13. The method of one of examples 10 to 12, further including: obtaining measurements of the second post-bond wafer to obtain a physical parameter of the second post-bond wafer; generating, by the model, a second wafer bonding recipe in accordance with the physical parameter of the second post-bond wafer; and bonding a fifth wafer to a sixth wafer in accordance with the second wafer bonding recipe to form a third post-bond wafer.

Example 14. A processing system including: a non-transitory computer-readable storage medium including instructions that when executed cause a processor of a computing device to perform operations in coordination with a semiconductor wafer fabrication process, the instructions including: having a first wafer bonding recipe and a model of a wafer bonding process, the model including an input indicative of a physical parameter of a first wafer to be bonded to a second wafer and configured to output a wafer bonding recipe based on the physical parameter of the first wafer; obtaining measurements of the first wafer to obtain the physical parameter of the first wafer; generating, by the model, the first wafer bonding recipe based on the physical parameter of the first wafer; and bonding the first wafer to the second wafer in accordance with the first wafer bonding recipe to produce a first post-bond wafer.

Example 15. The processing system of example 14, further including: a process chamber; a substrate holder in the process chamber, the substrate holder configured to mechanically support the second wafer when the first wafer is bonded to the second wafer; and a batch system to hold a plurality of wafers outside the process chamber.

Example 16. The processing system of one of examples 14 or 15, where the instructions further include deriving the model of the wafer bonding process including: obtaining measurements of third wafer and fourth wafer to obtain a physical parameter of the third wafer and a physical parameter of the fourth wafer; simulating wafer bonding of the third wafer and the fourth wafer in accordance with process conditions to estimate a physical parameter of a simulated post-bond wafer; and creating the model of the wafer bonding process in accordance with the physical parameter of the third wafer, the physical parameter of the fourth wafer, the process conditions, and the estimated physical parameter of the simulated post-bond wafer.

Example 17. The processing system of one of examples 14 to 16, where creating the model of the wafer bonding process includes: comparing the physical parameter of the third wafer, the physical parameter of the fourth wafer, the process conditions, and the estimated physical parameter of the simulated post-bond wafer; and determining the model of the wafer bonding process in accordance with the comparison.

Example 18. The processing system of one of examples 14 to 17, where generating the first wafer bonding recipe includes: estimating, by the model, post-bond distortions of the first post-bond wafer in accordance with the physical parameter of the first wafer; tuning process conditions of the first wafer bonding recipe to optimize the estimated post-bond distortions of the first post-bond wafer; and generating the first wafer bonding recipe in accordance with the tuned process conditions.

Example 19. The processing system of one of examples 14 to 18, where the instructions further include bonding a third wafer to a fourth wafer in accordance with the first wafer bonding recipe to produce a second post-bond wafer.

Example 20. The processing system of one of examples 14 to 19, where the processing system includes a wafer bonding system.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method comprising:
    having a first wafer bonding recipe and a model of a wafer bonding process, the model comprising an input indicative of a physical parameter of a first wafer to be bonded to a second wafer and configured to output a wafer bonding recipe based, at least in part, on the physical parameter of the first wafer, the physical parameter of the first wafer representing information relating to topographical features of the first wafer;
    obtaining measurements of the first wafer to obtain the physical parameter of the first wafer;
    generating, by the model, the first wafer bonding recipe based, at least in part, on the physical parameter of the first wafer; and
    bonding the first wafer to the second wafer in accordance with the first wafer bonding recipe to produce a first post-bond wafer.

2. The method of claim 1, further comprising annealing the first post-bond wafer to produce a fusion bonded wafer.

3. The method of claim 1, wherein the physical parameter of the first wafer comprises out-of-plane distortions of the first wafer.

4. The method of claim 1, further comprising deriving the model of the wafer bonding process comprising:
    obtaining measurements of a third wafer and a fourth wafer to obtain a physical parameter of the third wafer and a physical parameter of the fourth wafer;
    simulating wafer bonding of the third wafer and the fourth wafer in accordance with process conditions to estimate a physical parameter of a simulated post-bond wafer; and
    creating the model of the wafer bonding process in accordance with the physical parameter of the third wafer, the physical parameter of the fourth wafer, the process conditions, and the estimated physical parameter of the simulated post-bond wafer.

5. The method of claim 4, wherein creating the model of the wafer bonding process comprises:
    comparing the physical parameter of the third wafer, the physical parameter of the fourth wafer, the process conditions, and the estimated physical parameter of the simulated post-bond wafer; and
    determining the model of the wafer bonding process in accordance with the comparison.

6. The method of claim 5, wherein generating the first wafer bonding recipe comprises:
    estimating, by the model, post-bond distortions of the first post-bond wafer in accordance with the physical parameter of the first wafer;
    tuning process conditions of the first wafer bonding recipe to optimize the estimated post-bond distortions of the first post-bond wafer; and
    generating the first wafer bonding recipe in accordance with the tuned process conditions.

7. The method of claim 1, further comprising obtaining measurements of the second wafer to obtain a physical parameter of the second wafer, wherein the first wafer bonding recipe is further generated based on the physical parameter of the second wafer.

8. The method of claim 1, further comprising bonding a third wafer to a fourth wafer in accordance with the first wafer bonding recipe to produce a second post-bond wafer.

9. The method of claim 8, wherein the first wafer and the third wafer are part of a first wafer lot, and the second wafer and the fourth wafer are part of a second wafer lot, and wherein the first wafer lot and the second wafer lot are processed together in a semiconductor fabrication process flow.

10. A method comprising:
    having a model of a wafer bonding process, the model comprising an input indicative of a physical parameter of a first post-bond wafer and configured to output a wafer bonding recipe based on the physical parameter of the first post-bond wafer;
    bonding a first wafer to a second wafer in accordance with a wafer bonding recipe, to form the first post-bond wafer;
    obtaining measurements of the first post-bond wafer to obtain the physical parameter of the first post-bond wafer;
    generating, by the model, the first wafer bonding recipe in accordance with the physical parameter of the first post-bond wafer; and
    bonding a third wafer to a fourth wafer in accordance with the first wafer bonding recipe, to form a second post-bond wafer.

11. The method of claim 10, further comprising annealing the first post-bond wafer to produce a first fusion bonded wafer; and annealing the second post-bond wafer to produce a second fusion bonded wafer.

12. The method of claim 10, wherein obtaining measurements comprises scanning the first post-bond wafer to obtain the physical parameter of the first post-bond wafer.

13. The method of claim 10, further comprising:
    obtaining measurements of the second post-bond wafer to obtain a physical parameter of the second post-bond wafer;
    generating, by the model, a second wafer bonding recipe in accordance with the physical parameter of the second post-bond wafer; and
    bonding a fifth wafer to a sixth wafer in accordance with the second wafer bonding recipe to form a third post-bond wafer.

14. The method of claim 10, wherein the physical parameter of the first post-bond wafer represents topological information of the first post-bond wafer.

15. A processing system comprising:
    a non-transitory computer-readable storage medium comprising instructions that when executed cause a processor of a computing device to perform operations in coordination with a semiconductor wafer fabrication process, the instructions comprising:
        having a first wafer bonding recipe and a model of a wafer bonding process, the model comprising an input indicative of a physical parameter of a first wafer to be bonded to a second wafer and configured to output a wafer bonding recipe based on the physical parameter of the first wafer, the physical parameter of the first wafer representing information relating to topographical features of the first wafer;
obtaining measurements of the first wafer to obtain the physical parameter of the first wafer;
generating, by the model, the first wafer bonding recipe based on the physical parameter of the first wafer; and
bonding the first wafer to the second wafer in accordance with the first wafer bonding recipe to produce a first post-bond wafer.

16. The processing system of claim 15, further comprising:
a process chamber;
a substrate holder in the process chamber, the substrate holder configured to mechanically support the second wafer when the first wafer is bonded to the second wafer; and
a batch system to hold a plurality of wafers outside the process chamber.

17. The processing system of claim 15, wherein the instructions further comprise deriving the model of the wafer bonding process comprising:
obtaining measurements of third wafer and fourth wafer to obtain a physical parameter of the third wafer and a physical parameter of the fourth wafer;
simulating wafer bonding of the third wafer and the fourth wafer in accordance with process conditions to estimate a physical parameter of a simulated post-bond wafer; and
creating the model of the wafer bonding process in accordance with the physical parameter of the third wafer, the physical parameter of the fourth wafer, the process conditions, and the estimated physical parameter of the simulated post-bond wafer.

18. The processing system of claim 17, wherein creating the model of the wafer bonding process comprises:
comparing the physical parameter of the third wafer, the physical parameter of the fourth wafer, the process conditions, and the estimated physical parameter of the simulated post-bond wafer; and
determining the model of the wafer bonding process in accordance with the comparison.

19. The processing system of claim 18, wherein generating the first wafer bonding recipe comprises:
estimating, by the model, post-bond distortions of the first post-bond wafer in accordance with the physical parameter of the first wafer;
tuning process conditions of the first wafer bonding recipe to optimize the estimated post-bond distortions of the first post-bond wafer; and
generating the first wafer bonding recipe in accordance with the tuned process conditions.

20. The processing system of claim 15, wherein the instructions further comprise bonding a third wafer to a fourth wafer in accordance with the first wafer bonding recipe to produce a second post-bond wafer.

21. The processing system of claim 15, wherein the processing system comprises a wafer bonding system.

* * * * *